US010103911B2

(12) United States Patent
Shibasaki

(10) Patent No.: US 10,103,911 B2
(45) Date of Patent: Oct. 16, 2018

(54) RECEIVER CIRCUIT AND EYE MONITOR SYSTEM

(71) Applicant: FUJITSU LIMITED, Kawasaki-shi, Kanagawa (JP)

(72) Inventor: Takayuki Shibasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/913,122

(22) Filed: Mar. 6, 2018

(65) Prior Publication Data

US 2018/0262373 A1     Sep. 13, 2018

(30) Foreign Application Priority Data

Mar. 13, 2017 (JP) ................. 2017-047771

(51) Int. Cl.
*H04L 25/06*    (2006.01)
*H03K 5/08*    (2006.01)
(Continued)

(52) U.S. Cl.
CPC .......... *H04L 25/063* (2013.01); *H03K 5/086* (2013.01); *H04B 10/6933* (2013.01); *H04L 1/20* (2013.01); *H04L 25/4917* (2013.01)

(58) Field of Classification Search
CPC ..... H04L 7/0037; H04L 7/0331; H04L 1/203; H04L 27/01; H04L 25/063; H04L 1/20;
(Continued)

(56) References Cited

U.S. PATENT DOCUMENTS 9,419,746 B1*  8/2016 Baeckler ............... H04L 1/0001
2007/0075759 A1*  4/2007 Metz ..................... H03L 7/0812
327/158

(Continued)

FOREIGN PATENT DOCUMENTS

JP    2014-116880    6/2014
JP    2015-192200    11/2015

OTHER PUBLICATIONS

J-PlatPat English abstract for Japanese Patent Publication No. 2015-192200, published Nov. 2, 2015.
(Continued)

*Primary Examiner* — Khanh C Tran
(74) *Attorney, Agent, or Firm* — Staas & Halsey LLP

(57) ABSTRACT

A comparator circuit outputs a comparison result obtained by comparing a data signal with a threshold whose magnitude is adjusted based on a first offset value at a timing synchronized with a second clock signal whose phase is adjusted based on a difference in phase between the data signal and a first clock signal and a second offset value. An eye monitor circuit thins comparison results obtained in a clock data recovery (CDR) circuit for individual symbols of the data signal by comparing the data signal with a threshold, selects a comparison result corresponding to a symbol for which the comparison result is obtained by the comparator circuit, determines, by comparing the selected comparison result with the comparison result obtained by the comparator circuit, whether or not an error has occurred due to the first or second offset value, and outputs the number of times the error has occurred.

9 Claims, 17 Drawing Sheets

(51) Int. Cl.
*H04L 1/20* (2006.01)
*H04L 25/49* (2006.01)
*H04B 10/69* (2013.01)

(58) Field of Classification Search
CPC ............. H04L 25/4917; H03L 2207/50; H03L 7/0816; H03L 7/089; H04B 10/6971; H04B 10/6933
See application file for complete search history.

(56) References Cited

U.S. PATENT DOCUMENTS

| | | | |
|---|---|---|---|
| 2010/0329322 A1* | 12/2010 | Mobin | H04L 25/03057 375/231 |
| 2012/0187986 A1* | 7/2012 | Hamano | H03K 3/356139 327/156 |
| 2013/0271193 A1* | 10/2013 | Keith | H03L 7/0812 327/158 |
| 2014/0159786 A1 | 6/2014 | Hashida | |
| 2014/0286457 A1* | 9/2014 | Chaivipas | H04L 27/22 375/329 |
| 2015/0280948 A1 | 10/2015 | Nakao | |
| 2016/0006589 A1* | 1/2016 | Kamali | H04L 27/01 375/232 |

OTHER PUBLICATIONS

J-PlatPat English abstract for Japanese Patent Publication No. 2014-116880, published Jun. 26, 2014.

\* cited by examiner

RECEIVER CIRCUIT AND EYE MONITOR SYSTEM

CROSS-REFERENCE TO RELATED APPLICATION

This application is based upon and claims the benefit of priority of the prior Japanese Patent Application No. 2017-047771, filed on Mar. 13, 2017, the entire contents of which are incorporated herein by reference.

FIELD

The embodiments discussed herein are related to a receiver circuit and an eye monitor system.

BACKGROUND

With receiver circuits used in information processing units, large scale integrated circuits (LSI), and the like, clock data recovery (CDR) by which a value (data) and a clock signal are reproduced from a transmitted data signal is performed. With the CDR, in order to make a data decision (sampling) at a proper timing, the difference in phase between a clock signal for data decision and a data signal is detected and a phase of the clock signal is adjusted.

Formerly, a CDR circuit which performs two sampling operations per symbol (which may also be referred to as a unit interval (UI)) of a data signal (hereinafter referred to as 2× sampling) has been known. With this CDR circuit, a second clock signal other than a clock signal for data decision is used for detecting an edge portion (zero-crossing point) of a data signal. Furthermore, on the basis of an amplitude level of the data signal at a timing synchronized with the second clock signal, adjustment is made so that the timing will be locked at the zero-crossing point. The clock signal for data decision is adjusted so that its phase will deviate 0.5 UIs from that of the above second clock signal.

With a CDR circuit which performs 2× sampling, however, two sampling operations are performed per symbol. As a result, power consumption increases. A CDR circuit which performs one sampling operation per symbol (hereinafter referred to as 1× sampling) is known as a CDR circuit which reduces power consumption based on a clock signal. With a CDR circuit which performs 1× sampling, a data decision circuit (including, for example, an equalizer) decides a value of a data signal for each symbol at a timing synchronized with a clock signal. Furthermore, on the basis of an amplitude level of the data signal at a timing at which data corresponding to two symbols is decided, a difference in phase is detected and a phase of the clock signal is adjusted.

By the way, a receiver circuit may include an eye monitoring function for evaluating receiving characteristics within the circuit. The eye monitoring function is the function of detecting how a bit error rate (BER) changes when a phase of a clock signal and a threshold for data decision are changed. If the eye monitoring function is applied to a CDR circuit which performs 2× sampling, an offset value is added to a phase of a clock signal for data decision.

In view of a situation in which the operating speeds of circuits and elements are approaching the limits, adoption of a multilevel transmission technology, such as Pulse Amplitude Modulation 4 (PAM-4), is proposed in the latest communication standard as a technology for improving a data rate without increasing an operating speed.

See, for example, Japanese Laid-open Patent Publication No. 2015-192200.

With a receiver circuit including a CDR circuit which performs 1× sampling, the following problem arises. If an offset value is added to a phase of a clock signal used both for data decision and for phase difference detection, then the offset value is canceled by a phase adjustment function. As a result, an eye monitoring function is not realized. In order to realize an eye monitoring function, a clock signal whose phase is adjustable by an offset value and a data decision circuit are added and a data decision result for eye monitoring is outputted to the data decision circuit at a timing synchronized with the clock signal. In that case, however, there arises a problem that power consumption increases. If a multilevel transmission technology is used, this problem becomes more serious as the scale of a data decision circuit increases.

SUMMARY

According to an aspect, there is provided a receiver circuit including a clock data recovery (CDR) circuit which receives a data signal, which detects, based on a first comparison result obtained by comparing the data signal with a first threshold at a first timing synchronized with a first clock signal and a second comparison result obtained by comparing the data signal with a plurality of second thresholds at the first timing, a difference in phase between the data signal and the first clock signal, and which adjusts a phase of the first clock signal, based on the difference in phase; a comparator circuit which outputs a third comparison result obtained by comparing the data signal with a third threshold whose magnitude is adjusted based on a first offset value at a second timing synchronized with a second clock signal whose phase is adjusted based on the difference in phase and a second offset value; and an eye monitor circuit which thins the first comparison result obtained for individual symbols of the data signal or a first value obtained based on the first comparison result, which selects a fourth comparison result or a second value corresponding to a first symbol for which the third comparison result is obtained, which determines, by comparing the third comparison result with the fourth comparison result or the second value, whether or not an error has occurred due to the first offset value or the second offset value, and which outputs a number of times the error has occurred.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
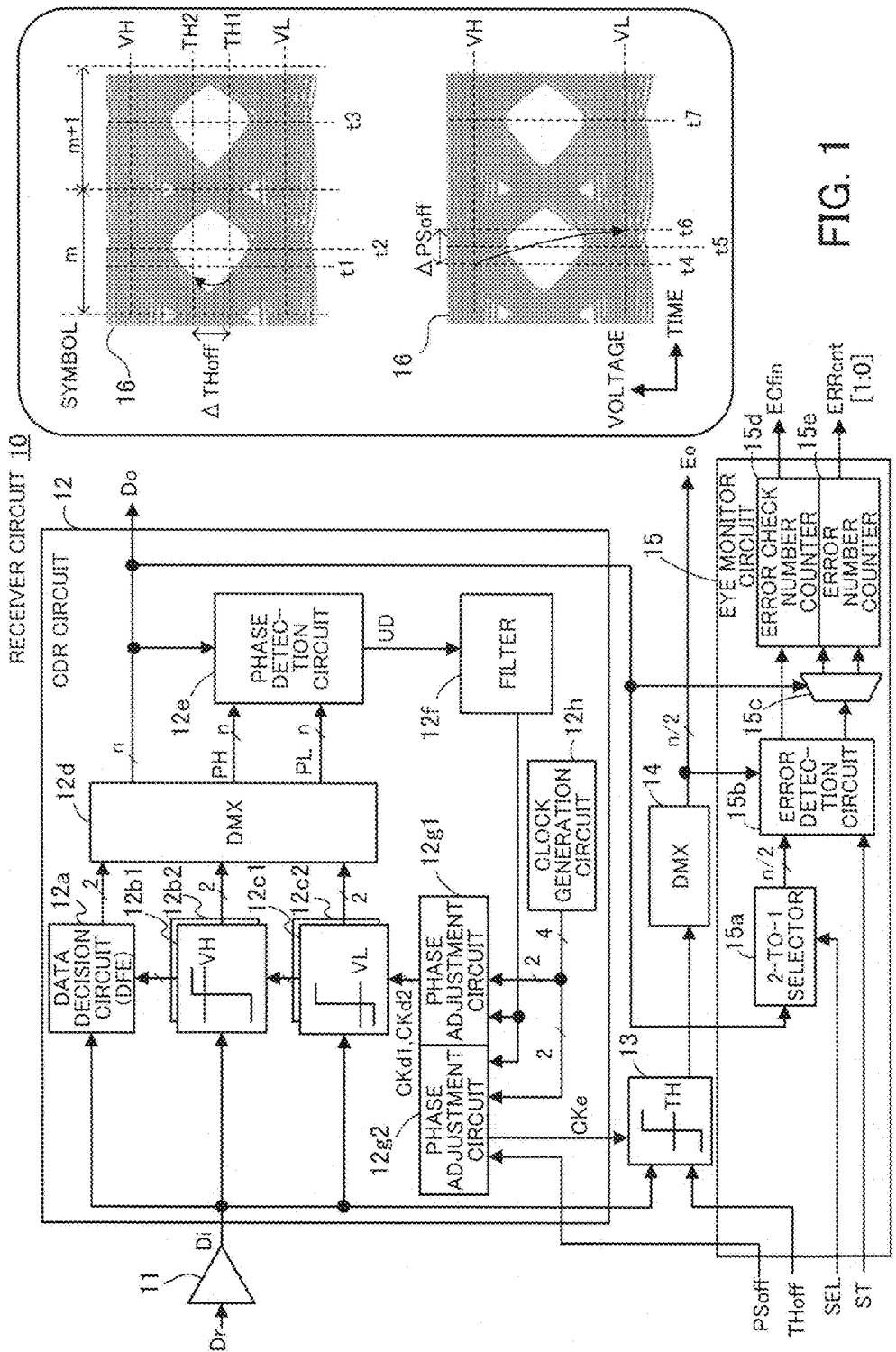
FIG. 1 illustrates an example of a receiver circuit according to a first embodiment.

Embodiments will now be described with reference to the accompanying drawings, wherein like reference numerals refer to like elements throughout.

First Embodiment

FIG. 1 illustrates an example of a receiver circuit according to a first embodiment.

FIG. 1 illustrates an example of a receiver circuit 10 which performs a half rate operation.

The receiver circuit 10 includes an equalizer 11, a CDR circuit 12, a comparator circuit 13, a demultiplexer (denoted by DMX in FIG. 1) 14, and an eye monitor circuit 15.

The equalizer 11 receives a data signal Dr having two values, that is to say 0 or 1 per symbol, performs an equalization process on the data signal Dr, and outputs a data signal Di. For example, a continuous-time linear equalizer (CTLE) is used as the equalizer 11. An amplifier may be used in place of the equalizer 11. In that case, the amplifier outputs the data signal Di by amplifying the data signal Dr.

The CDR circuit 12 includes a data decision circuit 12a, comparator circuits 12b1, 12b2, 12c1, and 12c2, a demultiplexer 12d, a phase detection circuit 12e, a filter 12f, phase adjustment circuits 12g1 and 12g2, and a clock generation circuit 12h.

Figure 2:
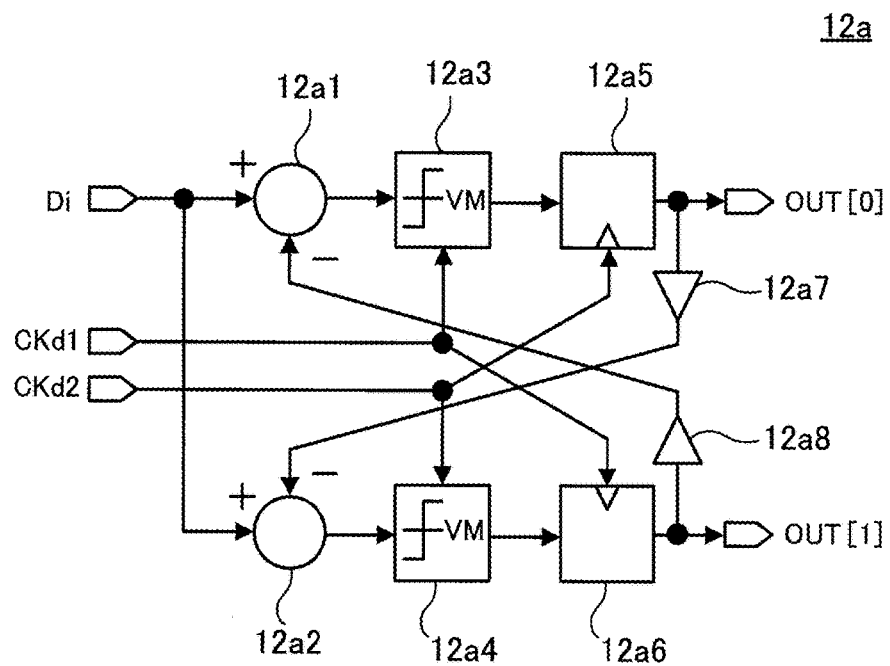
FIG. 2 illustrates an example of a data decision circuit.
Figure 3:
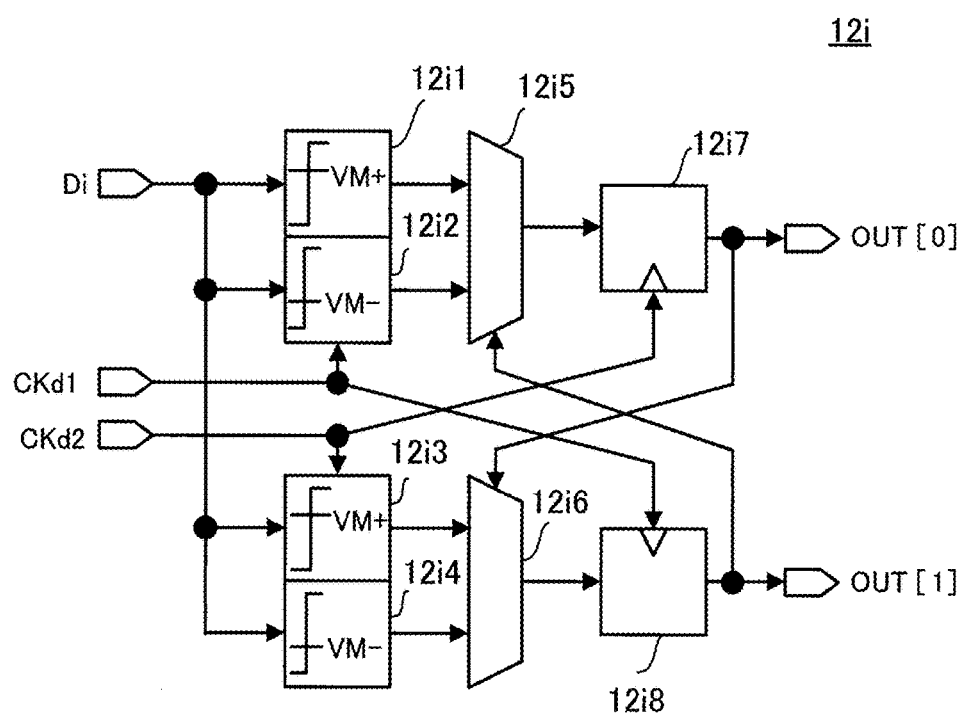
FIG. 3 illustrates another example of a data decision circuit.

The data decision circuit 12a is, for example, a decision feedback equalizer (DFE) and includes more than one comparator circuit (see FIGS. 2 and 3). The DFE performs an equalization process for suppressing inter-symbol interference (ISI) and makes a data decision. Because the data decision circuit 12a performs a half rate operation, the data decision circuit 12a outputs a comparison result (data decision result) obtained by comparing the data signal Di with a threshold at timings synchronized with clock signals CKd1 and CKd2. The clock signals CKd1 and CKd2 differ in phase by 180 degrees. Timings at which one clock signal rises and falls may be considered as the clock signals CKd1 and CKd2 respectively.

The comparator circuit 12b1 outputs a comparison result obtained by comparing the data signal Di with a threshold VH at a timing synchronized with the clock signal CKd1.

The comparator circuit 12b2 outputs a comparison result obtained by comparing the data signal Di with the threshold VH at a timing synchronized with the clock signal CKd2.

The comparator circuit 12c1 outputs a comparison result obtained by comparing the data signal Di with a threshold VL at the timing synchronized with the clock signal CKd1.

The comparator circuit 12c2 outputs a comparison result obtained by comparing the data signal Di with the threshold VL at the timing synchronized with the clock signal CKd2.

If the voltage of the data signal Di changes between −1 and +1, then the center of the amplitude of the data signal Di is 0 V. For example, the thresholds VH and VL are set to +$\frac{2}{3}$ and −$\frac{2}{3}$ respectively.

The demultiplexer 12d demultiplxes a 2-bit comparison result outputted by the data decision circuit 12a into n-bit data and outputs it as an output data signal Do. Furthermore, the demultiplexer 12d demultiplxes a 2-bit comparison result composed of a 1-bit comparison result outputted by each of the comparator circuits 12b1 and 12b2 into n-bit data and outputs it as a comparison result PH. In addition, the demultiplexer 12d demultiplxes a 2-bit comparison result composed of a 1-bit comparison result outputted by each of the comparator circuits 12c1 and 12c2 into n-bit data and outputs it as a comparison result PL. n is set, for example, according to the processing capability (which depends on the frequency of an operation clock signal (not illustrated)) of the phase detection circuit 12e realized by a digital circuit.

The phase detection circuit 12e receives the n-bit output data signal Do and comparison results PH and PL outputted by the demultiplexer 12d. On the basis of the output data signal Do and the comparison results PH and PL, the phase detection circuit 12e detects the difference in phase between the data signal Di and the clock signals CKd1 and CKd2. Furthermore, the phase detection circuit 12e outputs a phase difference signal UD as a result of the phase difference detection.

The phase detection circuit 12e is, for example, a Mueller-Muller (MM) phase detection circuit. The MM phase detection circuit outputs the phase difference signal UD on the basis of the comparison results PH and PL and a value of the output data signal Do corresponding to two successive symbols.

In the following description of an example of outputting a phase difference signal UD, it is assumed, for example, that the data signal Di is 1 during a first symbol of two successive symbols and that the data signal Di is 0 during a second symbol of the two successive symbols. If an amplitude level of the data signal Di is lower than the threshold VH for the first symbol and is lower than the threshold VL for the second symbol, then it is detected that the phases of the clock signals CKd1 and CKd2 are behind the phase of the center of an eye of an eye pattern of the data signal Di. In this case, a phase difference signal UD which is indicative that the phases of the clock signals CKd1 and CKd2 are delayed is outputted.

On the other hand, if an amplitude level of the data signal Di is higher than the threshold VH for the first symbol and is higher than the threshold VL for the second symbol, then it is detected that the phases of the clock signals CKd1 and CKd2 are ahead of the phase of the center of the eye of the eye pattern of the data signal Di. In this case, a phase difference signal UD which is indicative that the phases of the clock signals CKd1 and CKd2 are advanced is outputted.

The filter 12f filters the phase difference signal UD and generates an adjustment signal. The filter 12f is not limited to a digital filter. The filter 12f may be a circuit which includes a charge pump or the like for adjusting a current value according to the phase difference signal UD, which converts the adjusted current value to a voltage value, and which outputs the voltage value as an adjustment signal.

The phase adjustment circuit 12g1 receives two of four (or three) clock signals outputted by the clock generation circuit 12h and outputs the clock signals CKd1 and CKd2 whose phases are adjusted on the basis of the adjustment signal outputted by the filter 12f.

The phase adjustment circuit 12g2 receives two (or one) clock signals outputted by the clock generation circuit 12h and outputs a clock signal CKe whose phase is adjusted on the basis of the adjustment signal outputted by the filter 12f and an offset value PSoff.

The clock generation circuit 12h generates and outputs, for example, four (or three) clock signals of the same frequency.

The comparator circuit 13 outputs a comparison result obtained by comparing the data signal Di with a threshold TH whose magnitude is adjusted on the basis of an offset value THoff at a timing synchronized with the clock signal CKe.

The demultiplexer 14 demultiplexes a 1-bit comparison result outputted by the comparator circuit 13 into n/2-bit data and outputs it as a data signal Eo.

The eye monitor circuit 15 thins comparison results obtained by the data decision circuit 12a for individual symbols of the data signal Di and selects a comparison result for a symbol for which a comparison result is obtained by the comparator circuit 13. Furthermore, the eye monitor circuit 15 compares the selected comparison result with the comparison result obtained by the comparator circuit 13. By doing so, the eye monitor circuit 15 determines whether or not an error has occurred due to the offset values PSoff and THoff, and outputs an error count ERRcnt[1:0] indicative of the number of times an error has occurred. When an error determination is made a determined number of times, the eye monitor circuit 15 illustrated in FIG. 1 outputs 1 as a signal ECfin to that effect.

The eye monitor circuit 15 includes a 2-to-1 selector 15a, an error detection circuit 15b, a selector 15c, an error check number counter 15d, and an error number counter 15e.

The 2-to-1 selector 15a receives the output data signal Do and a selection signal SEL, selects odd bits or even bits from the n-bit output data signal Do on the basis of the selection signal SEL, and outputs them as a n/2-bit data signal. That is to say, the 2-to-1 selector 15a has the function of thinning the comparison results obtained by the data decision circuit 12a. The data decision circuit 12a outputs a comparison result for every symbol. On the other hand, the comparator circuit 13 outputs a comparison result once every two symbols. Therefore, the 2-to-1 selector 15a having the above thinning function is used so as to enable a comparison for the same symbol.

The error detection circuit 15b receives the n/2-bit data signal Eo outputted by the demultiplexer 14 and the n/2-bit data signal outputted by the 2-to-1 selector 15a. Furthermore, the error detection circuit 15b compares comparison results obtained by the data decision circuit 12a and the comparator circuit 13 for the same symbol of the data signal Di to determine whether or not they match. In other words, the error detection circuit 15b uses the offset values PSoff and THoff for making an error determination, that is to say, for determining whether or not there is a mismatch between the data signal Eo and the output data signal Do (whether or not an error occurs). Furthermore, each time the error detection circuit 15b makes an error determination, the error detection circuit 15b outputs a signal to the effect that the error detection circuit 15b has made an error determination. If an error has occurred, the error detection circuit 15b outputs a signal which is indicative that an error has occurred.

The error detection circuit 15b receives a start signal ST. When the start signal ST changes from 0 to 1, the error detection circuit 15b detects synchronization (lock) between the phases of the data signal outputted by the 2-to-1 selector 15a and the data signal Eo. After the error detection circuit 15b detects the lock, the error detection circuit 15b begins an error determination.

The selector 15c receives a signal which is outputted by the error detection circuit 15b and which is indicative that an error has occurred, and separately outputs a signal which is indicative that an error has occurred during one symbol according to a value of a comparison result obtained by the data decision circuit 12a for a symbol before the one symbol. The reason for this will be described later. In the example of FIG. 1, the data decision circuit 12a is a DFE and the selector 15c corresponds to a case where the tap number of the DFE is one. In this case, the selector 15c separately outputs a signal which is indicative that an error has occurred according to whether a value of the output data signal Do before one bit (one symbol) is 0 or 1, and is therefore a 1-to-2 selector.

If the tap number of the DFE is n (n≥2) (if the influence of ISI caused by a symbol before two or more symbols is also taken into consideration), then the selector 15c is a 1-to-$2^n$ selector.

The error check number counter 15d receives a signal which is outputted by the error detection circuit 15b and which is indicative that the error detection circuit 15b has made an error determination and counts the number of times (error check count) the error detection circuit 15b has made an error determination. Furthermore, when a count value reaches a determined value, the error check number counter 15d outputs 1 as the signal ECfin.

The error number counter 15e receives a signal which is outputted by the selector 15c and which is indicative that an error has occurred, and separately counts the number of times an error has occurred according to whether a value of the output data signal Do before one bit is 0 or 1. Furthermore, the error number counter 15e outputs a count result as the error count ERRcnt[1:0].

If the data decision circuit 12a is an n-tap DFE (n≥2), then the error number counter 15e outputs $2^n$ kinds of error counts.

For example, the offset values PSoff and THoff, the selection signal SEL, and the start signal ST are supplied from a control unit (not illustrated) outside or inside the receiver circuit 10. For example, the offset values PSoff and THoff are digital codes.

FIG. 1 illustrates two successive symbols m and (m+1) of the data signal Di and an example of adjusting the offset values PSoff and THoff. In FIG. 1, a horizontal axis indicates time and a vertical axis indicates voltage. A waveform 16 is obtained by superimposing all transitions of the data signal Di. Timings t1, t4, and t6 are synchronized with the clock signal CKe, timings t2 and t5 are synchronized with the clock signal CKd1, and timings t3 and t7 are synchronized with the clock signal CKd2.

For example, if the offset value THoff is incremented by ΔTHoff at the timing t1, then the threshold TH in the comparator circuit 13 increases from a threshold TH1 to a threshold TH2.

Furthermore, if the offset value THoff reaches a maximum value (value of the offset value THoff by which the threshold TH reaches the threshold VH, in the example of FIG. 1) at the timing t4, then the offset value PSoff is incremented by ΔPSoff. The offset value THoff is set to a minimum value (value of the offset value THoff by which the threshold TH becomes the threshold VL, in the example of FIG. 1).

A method for adjusting the offset values THoff and PSoff is not limited to the above method. For example, if a BER obtained on the basis of the error count ERRcnt exceeds a determined value, then the control unit (not illustrated) may stop incrementing the offset values THoff and PSoff and return the offset values THoff and PSoff to minimum values.

(Example of Data Decision Circuit 12a)

FIG. 2 illustrates an example of a data decision circuit. FIG. 2 illustrates 1-tap direct feedback DFE corresponding to a half rate operation as an example of the data decision circuit 12a.

The data decision circuit 12a includes adders 12a1 and 12a2, comparator circuits 12a3 and 12a4, registers 12a5 and 12a6, and amplifiers 12a7 and 12a8.

The adder 12a1 subtracts from the data signal Di a correction value (positive or negative value) outputted by the amplifier 12a8. The adder 12a2 subtracts from the data signal Di a correction value (positive or negative value) outputted by the amplifier 12a7.

The comparator circuit 12a3 outputs a comparison result (0 or 1) obtained by comparing an output signal from the adder 12a1 with a threshold VM (0 V, for example) at a timing synchronized with the clock signal CKd1. The comparator circuit 12a4 outputs a comparison result (0 or 1) obtained by comparing an output signal from the adder 12a2 with the threshold VM at a timing synchronized with the clock signal CKd2.

The register 12a5 stores a value outputted by the comparator circuit 12a3 at a timing synchronized with the clock signal CKd2 and outputs it as an output signal OUT[0]. The register 12a6 stores a value outputted by the comparator circuit 12a4 at a timing synchronized with the clock signal CKd1 and outputs it as an output signal OUT[1].

The amplifier 12a7 outputs a correction value obtained by multiplying the output signal OUT[0] by a determined equalization coefficient (corresponding to the gain of the amplifier 12a7). The amplifier 12a8 outputs a correction value obtained by multiplying the output signal OUT[1] by the above equalization coefficient (corresponding to the gain of the amplifier 12a8). The equalization coefficient is a value corresponding to the influence of ISI caused by a value before one bit. If the output signals OUT[0] and OUT[1] are 0, then a correction value is negative. If the output signals OUT[0] and OUT[1] are 1, then a correction value is positive.

The above data decision circuit 12a outputs the output signal OUT[0] and the output signal OUT[1] alternately. Furthermore, the data decision circuit 12a subtracts from the data signal Di the amount of signal degradation which occurs according to a value before one bit (output signal OUT[0] or output signal OUT[1]) as the above correction value. By doing so, the data decision circuit 12a corrects the signal degradation.

However, a feedback loop of the direct feedback DFE includes the adders 12a1 and 12a2 and the like having long delay time.

Therefore, the following data decision circuit may be used in place of the data decision circuit 12a illustrated in FIG. 2.

FIG. 3 illustrates another example of a data decision circuit.

A data decision circuit 12i is a 1-tap speculative DFE corresponding to a half rate operation.

The data decision circuit 12i includes comparator circuits 12i1, 12i2, 12i3, and 12i4, selectors 12i5 and 12i6, and registers 12i7 and 12i8.

The comparator circuit 12i1 outputs a comparison result (0 or 1) obtained by comparing the data signal Di with a threshold VM+ (value obtained by adding the above correction value to 0 V, for example) at a timing synchronized with the clock signal CKd1. The comparator circuit 12i2 outputs a comparison result (0 or 1) obtained by comparing the data signal Di with a threshold VM− (value obtained by subtracting the above correction value from 0 V, for example) at a timing synchronized with the clock signal CKd1.

The comparator circuit 12i3 outputs a comparison result (0 or 1) obtained by comparing the data signal Di with the threshold VM+ at a timing synchronized with the clock signal CKd2. The comparator circuit 12i4 outputs a comparison result (0 or 1) obtained by comparing the data signal Di with the threshold VM− at a timing synchronized with the clock signal CKd2.

If an output signal OUT[1] from the register 12i8 is 1, then the selector 12i5 selects and outputs the comparison result obtained by the comparator circuit 12i1. If an output signal OUT[1] from the register 12i8 is 0, then the selector 12i5 selects and outputs the comparison result obtained by the comparator circuit 12i2.

If an output signal OUT[0] from the register 12i7 is 1, then the selector 12i6 selects and outputs the comparison result obtained by the comparator circuit 12i3. If an output signal OUT[0] from the register 12i7 is 0, then the selector 12i6 selects and outputs the comparison result obtained by the comparator circuit 12i4.

The register 12i7 stores a value outputted by the selector 12i5 at a timing synchronized with the clock signal CKd2 and outputs it as the output signal OUT[0]. The register 12i8 stores a value outputted by the selector 12i6 at a timing synchronized with the clock signal CKd1 and outputs it as the output signal OUT[1].

With the above data decision circuit 12i, one of comparison results obtained by the comparator circuits 12i1 through 12i4 each of which compares the threshold VM+ or VM− with the data signal Di is selected and outputted according to a value before one bit. The thresholds VM+ and VM− are given in advance the correction value in which the influence of ISI is taken into consideration. By doing so, signal degradation is corrected. The data decision circuit 12i uses the selectors 12i5 and 12i6 and the like having comparatively short delay time. As a result, delay time of its feedback loop is short compared with the direct feedback DFE.

(Example of Eye Monitoring Using Receiver Circuit 10)

An example of eye monitoring using the receiver circuit 10 illustrated in FIG. 1 will now be described.

Figure 4:
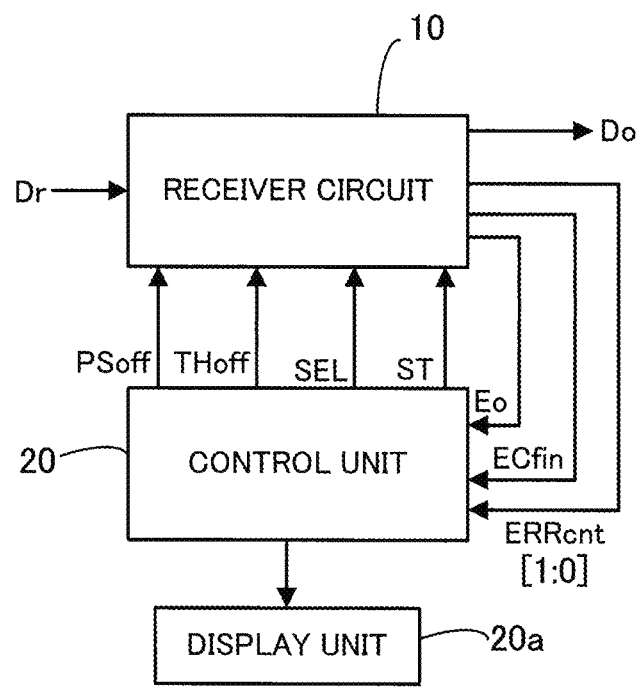
FIG. 4 illustrates an example of an eye monitor system which performs eye monitoring.

FIG. 4 illustrates an example of an eye monitor system which performs eye monitoring.

An eye monitor system includes the receiver circuit 10, a control unit 20, and a display unit 20a.

The control unit 20 supplies offset values PSoff and THoff, a selection signal SEL, and a start signal ST to the receiver circuit 10 and receives a data signal Eo, a signal ECfin, and an error count ERRcnt[1:0] from the receiver circuit 10. Furthermore, the control unit 20 executes software stored in a memory (not illustrated) and causes the display unit 20a to display an eye waveform on the basis of the signal ECfin and the error count ERRcnt[1:0] obtained when the offset values PSoff and THoff are changed.

For example, the control unit 20 may be a computer (such as a personal computer) or a processor mounted on the same board where the receiver circuit 10 is mounted.

Figure 5:
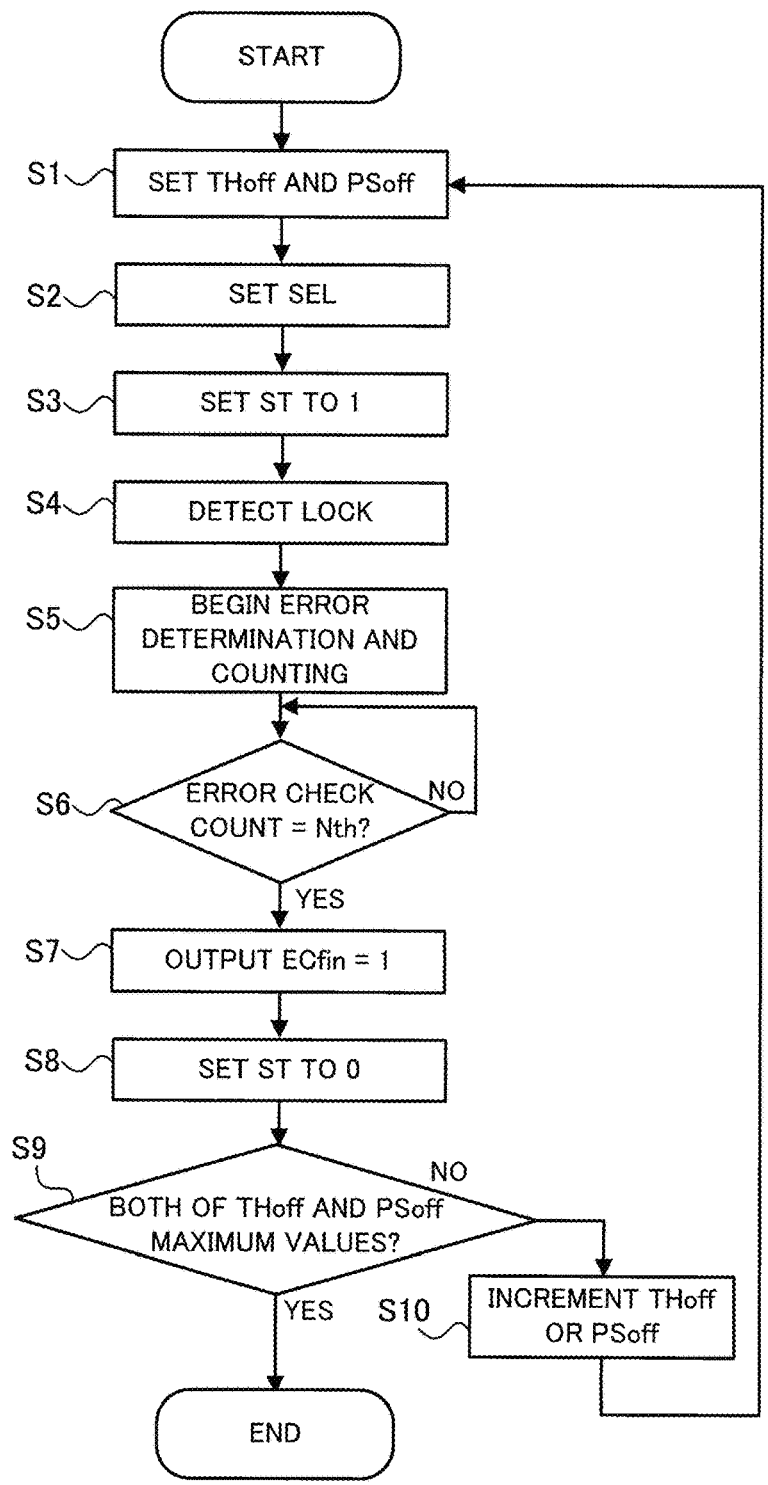
FIG. 5 is a flow chart illustrative of an example of the eye monitoring operation of a receiver circuit controlled by a control unit.

FIG. 5 is a flow chart illustrative of an example of the eye monitoring operation of a receiver circuit controlled by a control unit.

For example, an eye monitoring operation is performed when a prototype of the receiver circuit 10 is made and its operation is tested, when the receiver circuit 10 is tested before shipment, or when operation of a transmitting and receiving system including the receiver circuit 10 is tested.

First the offset value THoff is set in the comparator circuit 13 under the control of the control unit 20. Furthermore, the offset value PSoff is set in the phase adjustment circuit 12g2 (step S1). In addition, the selection signal SEL for the 2-to-1 selector 15a is set (step S2) and the start signal ST for the error detection circuit 15b is set to 1 (step S3).

When the start signal ST is set to 1, the error detection circuit 15b detects synchronization (lock) between the phases of a data signal outputted by the 2-to-1 selector 15a and a data signal Eo (step S4). After the error detection circuit 15b detects the lock, the error detection circuit 15b begins an error determination (step S5). Furthermore, in step S5, the error check number counter 15d receives a signal which is outputted by the error detection circuit 15b and which is indicative that an error determination has been made and begins to count the number of times an error determination has been made (error check count). Furthermore, the error number counter 15e receives a signal which is outputted by the selector 15c and which is indicative that an error has occurred, and separately counts the number of times an error has occurred according to whether a value of an output data signal Do before one bit is 0 or 1.

The error check number counter 15d determines whether or not the error check count (count value) reaches a determined value Nth (step S6). If the error check count does not reach the value Nth, then step S6 is repeated. If the error check count reaches the value Nth, then the error check number counter 15d outputs 1 as a signal ECfin (step S7).

When the signal ECfin becomes 1, the start signal ST is set to 0 under the control of the control unit 20 (step S8). As a result, the error detection circuit 15b stops an error determination.

After that, if both of the offset values THoff and PSoff are not maximum values (NO in step S9), then the offset value THoff or PSoff is incremented (step S10) and the process is repeated from step S1.

If both of the offset values THoff and PSoff are maximum values (YES in step S9), then the eye monitoring operation of the receiver circuit 10 ends.

For example, the control unit 20 causes the display unit 20a to display an eye waveform for each combination of values of the offset values THoff and PSoff on the basis of an error count ERRcnt[1:0] when the signal ECfin becomes 1.

For example, when a decision result outputted by the data decision circuit 12a is 1 for a symbol of a data signal Di, an increase in the offset value THoff causes an increase in a threshold TH and the threshold TH may exceed an amplitude level of the data signal Di. In that case, a decision result outputted by the comparator circuit 13 is inverted into 0. As a result, the error detection circuit 15b detects an error.

When the offset value THoff becomes larger, such an error is frequently detected. Furthermore, when the offset value THoff becomes smaller, the threshold TH frequently falls below an amplitude level of the data signal Di with the value being 0. As a result, an error is frequently detected. Accordingly, the control unit 20 estimates an amplitude level of the data signal Di from an increase in the error count ERRcnt[1:0], that is to say the height of an eye of the eye waveform.

When the offset value PSoff becomes larger (or becomes larger in a negative direction), the error count ERRcnt[1:0] also increases. For example, when the offset value PSoff becomes larger and a sampling timing exceeds the bounds of the eye, the error count ERRcnt increases. This makes it possible to estimate the width of the eye of the eye waveform.

In addition, the control unit 20 may correct an eye waveform on the basis of the correction value used in a data decision circuit 12a, 12i illustrated in FIG. 2, 3, to thereby obtain an eye waveform after an equalization process performed by the data decision circuit 12a, 12i.

Figure 6:
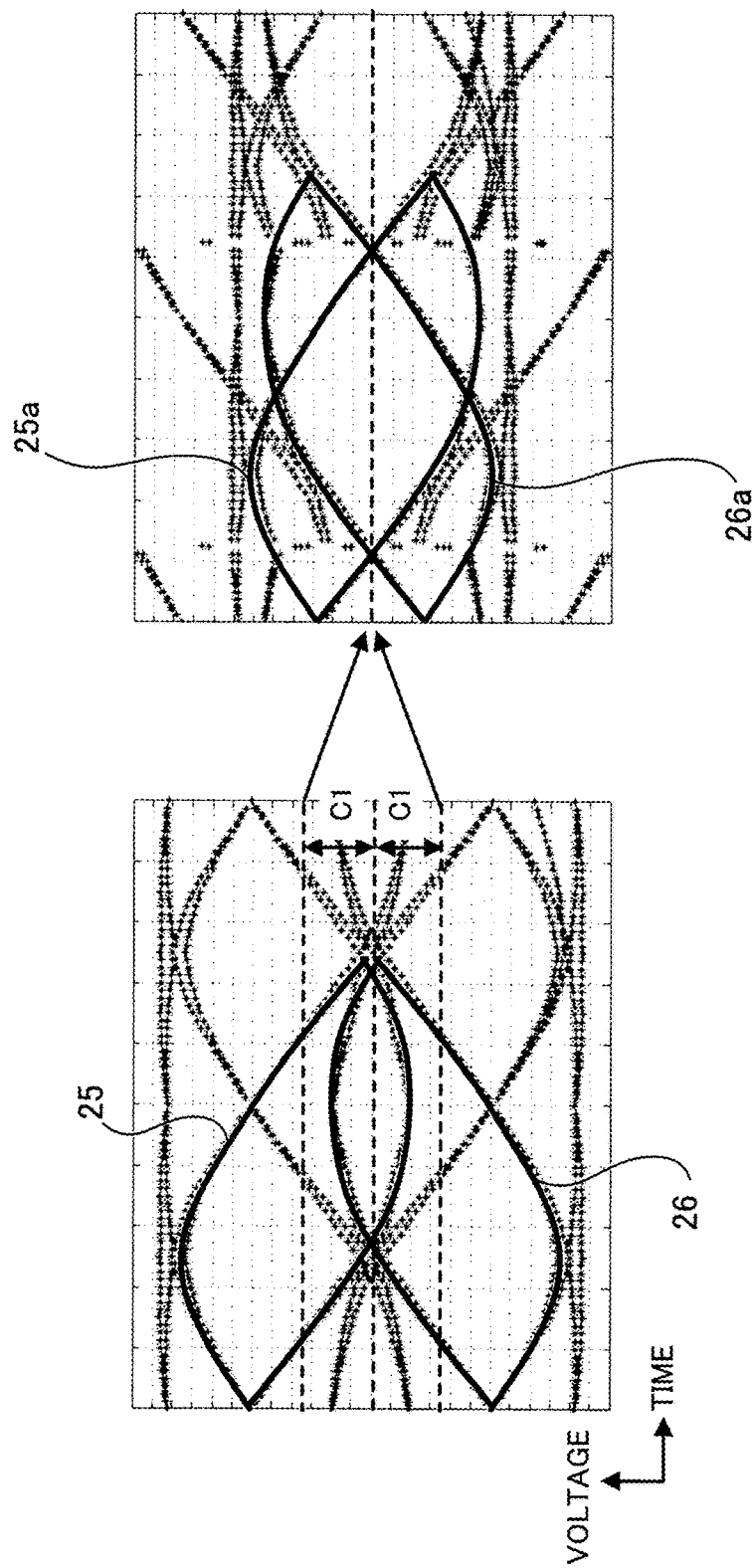
FIG. 6 illustrates an example of correcting an eye waveform.

FIG. 6 illustrates an example of correcting an eye waveform. In FIG. 6, a horizontal axis indicates time and a vertical axis indicates voltage.

An eye waveform 25 is obtained on the basis of the number of times an error has occurred when a value of an output data signal Do before one bit is 1. An eye waveform 26 is obtained on the basis of the number of times an error has occurred when a value of the output data signal Do before one bit is 0.

The control unit 20 obtains an eye waveform 25a by subtracting from the eye waveform 25 a correction value C1 used in a data decision circuit 12a, 12i. In addition, the control unit 20 obtains an eye waveform 26a by adding to the eye waveform 26 the correction value C1 used in the data decision circuit 12a, 12i. The control unit 20 holds the correction value C1 in advance.

Furthermore, the control unit 20 causes the display unit 20a to display the eye waveforms 25a and 26a with one over the other. By doing so, an eye waveform after an equalization process by the data decision circuit 12a, 12i is equivalently presented to, for example, a user.

The above eye monitoring function is realized by the use of the receiver circuit 10 according to the first embodiment. Furthermore, one comparator circuit 13 is used in place of a circuit which is the same as the data decision circuit 12a. This reduces power consumption.

If a circuit which is the same as the data decision circuit 12a is used in place of the comparator circuit 13, then the following receiver circuit is obtained, for example.

(Receiver Circuit as Comparative Example)

Figure 7:
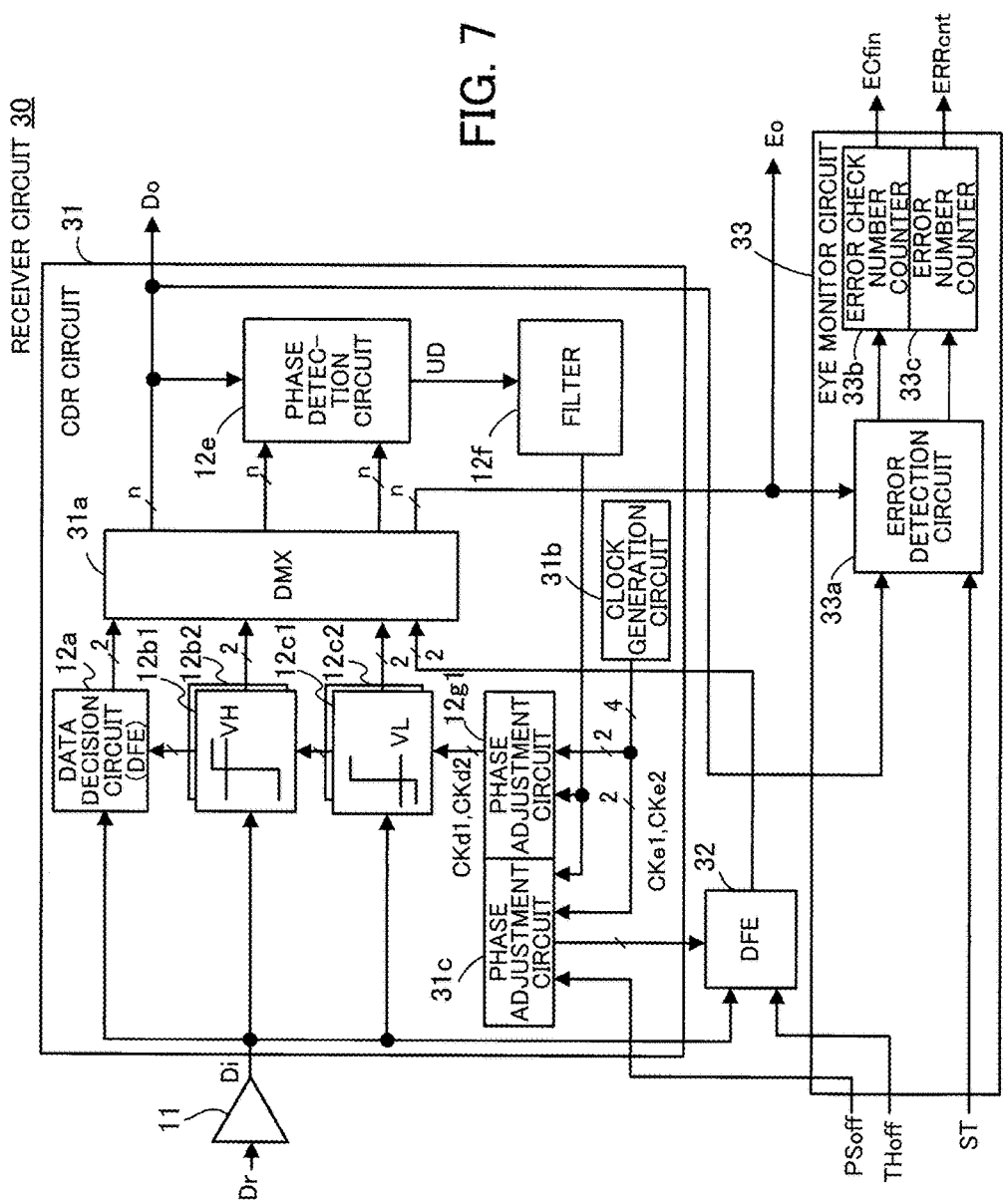
FIG. 7 illustrates a comparative example of a receiver circuit.

FIG. 7 illustrates a comparative example of a receiver circuit. Components in FIG. 7 which are the same as those illustrated in FIG. 1 are marked with the same numerals.

A receiver circuit 30 includes a DFE 32 in place of the comparator circuit 13 illustrated in FIG. 1. The DFE 32 is a circuit which is the same as the data decision circuit 12a illustrated in FIG. 2 or the data decision circuit 12i illustrated in FIG. 3. With the receiver circuit 30, a threshold with which the DFE 32 compares a data signal Di is adjusted by an offset value THoff. Because the DFE 32 performs a half rate operation, the DFE 32 outputs a comparison result obtained by comparing the data signal Di with the threshold at timings synchronized with clock signals CKe1 and CKe2 which differ in phase by 180 degrees.

Therefore, a clock generation circuit 31b outputs four clock signals. A phase adjustment circuit 31c adjusts phases of two of the four clock signals and outputs the clock signals CKe1 and CKe2.

A 2-bit comparison result outputted by the DFE is demultiplexed by a demultiplexer 31a of a CDR circuit 31 into an n-bit data and is outputted as a data signal Eo. Furthermore, the data signal Eo is supplied to an error detection circuit 33a of an eye monitor circuit 33.

The error detection circuit 33a makes an error determination on the basis of the data signal Eo and an output data signal Do. An error number counter 33c counts an error count and outputs it as an error count ERRcnt. Furthermore, when the number of times an error determination is made reaches a determined value, an error check number counter 33b outputs 1 as a signal ECfin.

With the receiver circuit 10 illustrated in FIG. 1, an eye monitoring function is realized by the use of one comparator circuit 13 in place of the above DFE 32 including a plurality of comparator circuits. This reduces power consumption. Furthermore, with the receiver circuit 30, an error determination is made for each symbol. As a result, the two clock signals CKe1 and CKe2 are used. With the receiver circuit 10, on the other hand, an error determination is made once every two symbols. Therefore, an eye monitoring function is realized by one clock signal CKe and power consumption is reduced.

In the above example, the receiver circuit 10 which performs a half rate operation has been described. However, the operation of the receiver circuit 10 is not limited to a half rate operation. For example, if the receiver circuit 10 is extended to a receiver circuit which performs a quarter rate operation, then the number of circuits is properly increased. For example, a data decision circuit 12a outputs a 4-bit comparison result at timings synchronized with four clock signals which differ in phase. In that case, for example, two comparator circuits which compare a threshold TH with a data signal Di at timings synchronized with two clock signals which differ in phase may be used in place of the comparator circuit 13. If the two comparator circuits are used, then comparison results obtained by the two comparator circuits and a comparison result obtained by the data decision circuit 12a are selected by a 2-to-1 selector 15a so as to correspond to the same symbol and then supplied to an error detection circuit 15b.

Second Embodiment

In the example of FIG. 1, the error detection circuit 15b makes an error determination on the assumption that the output data signal Do is correct. However, an error determination may be made by comparing an expected value obtained on the basis of an output data signal Do with a data signal Eo.

Figure 8:
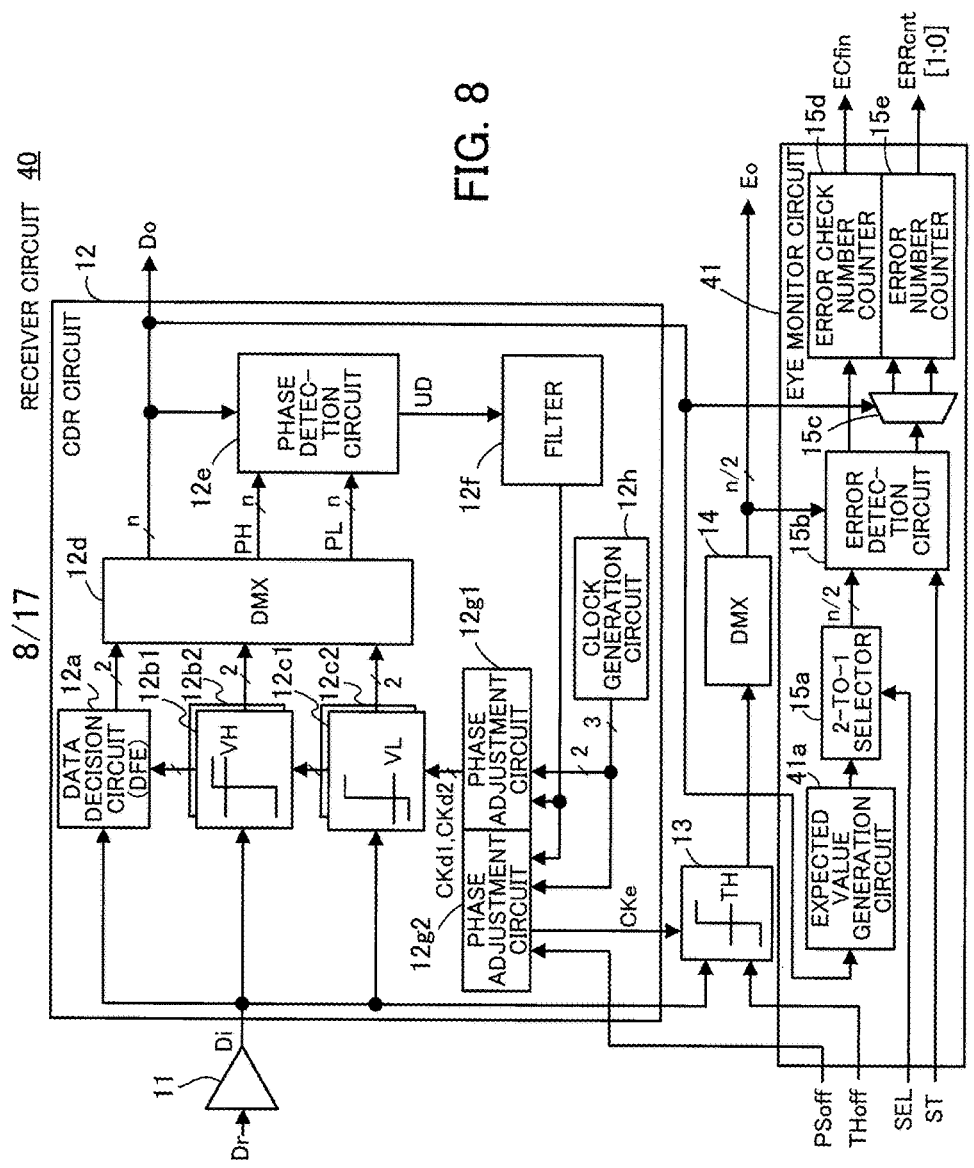
FIG. 8 illustrates an example of a receiver circuit according to a second embodiment.

FIG. 8 illustrates an example of a receiver circuit according to a second embodiment. Components in FIG. 8 which are the same as those illustrated in FIG. 1 are marked with the same numerals.

An eye monitor circuit 41 of a receiver circuit 40 according to the second embodiment includes an expected value generation circuit 41a.

The expected value generation circuit 41a outputs an expected value of a comparison result outputted by a data decision circuit 12a. An expected value is a value of a data pattern, such as 0101, in which 0 and 1 are repeated or a value of a predictable data pattern such as a pseudo-random bit sequence (PRBS). If a value of such a data pattern is used as an expected value, its test pattern is supplied as a data signal Dr to the receiver circuit 40 when an eye monitoring function is performed. After the expected value generation circuit 41a receives the above data pattern once as a seed (at initial operation, for example), the expected value generation circuit 41a estimates an expected value in accordance with the data pattern. As a result, even if an error occurs in an output data signal Do, it is possible to continue to output a correct value.

A 2-to-1 selector 15a and an error detection circuit 15b use an expected value in place of the output data signal Do and the same operation as performed by the receiver circuit 10 according to the first embodiment is carried out.

The other operations of the receiver circuit 40 are the same as those performed by the receiver circuit 10 illustrated in FIG. 1. The same effect that is obtained by the receiver circuit 10 is achieved by the receiver circuit 40.

Third Embodiment

Figure 9:
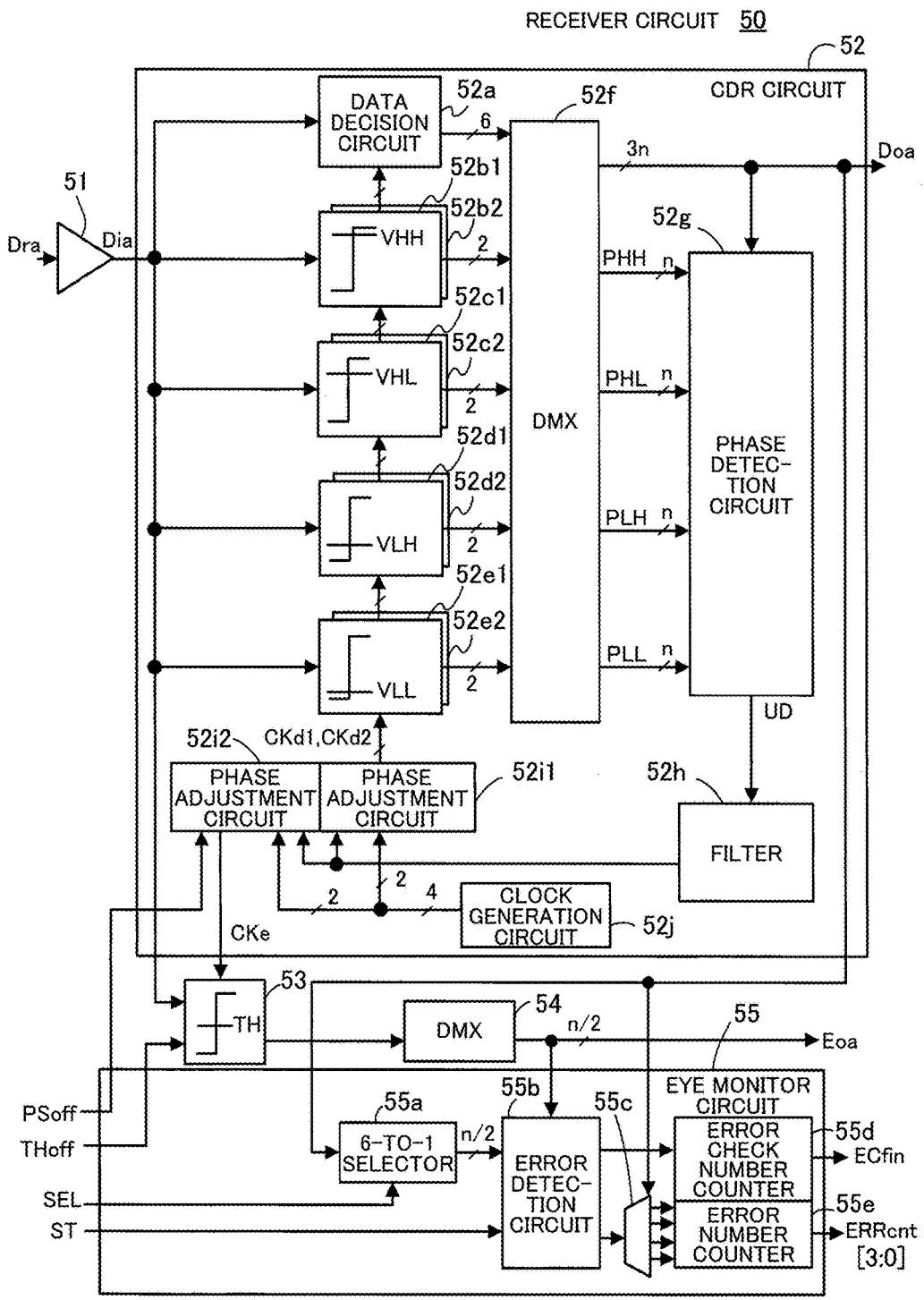
FIG. 9 illustrates an example of a receiver circuit according to a third embodiment.

FIG. 9 illustrates an example of a receiver circuit according to a third embodiment.

FIG. 9 illustrates an example of a receiver circuit 50 which receives a pulse amplitude modulation-4 (PAM-4) data signal Dra having four values per symbol and which performs a half rate operation.

The receiver circuit 50 includes an equalizer 51, a CDR circuit 52, a comparator circuit 53, a demultiplexer (denoted by DMX in FIG. 9) 54, and an eye monitor circuit 55.

The equalizer 51 receives a PAM-4 data signal Dra, performs an equalization process on the data signal Dra, and outputs a data signal Dia. For example, a CTLE is used as the equalizer 51. An amplifier may be used in place of the equalizer 51. In that case, the amplifier outputs the data signal Dia by amplifying the data signal Dra.

With PAM-4, a 2-bit value is associated with each of four potential levels separated by three thresholds.

Figure 10:
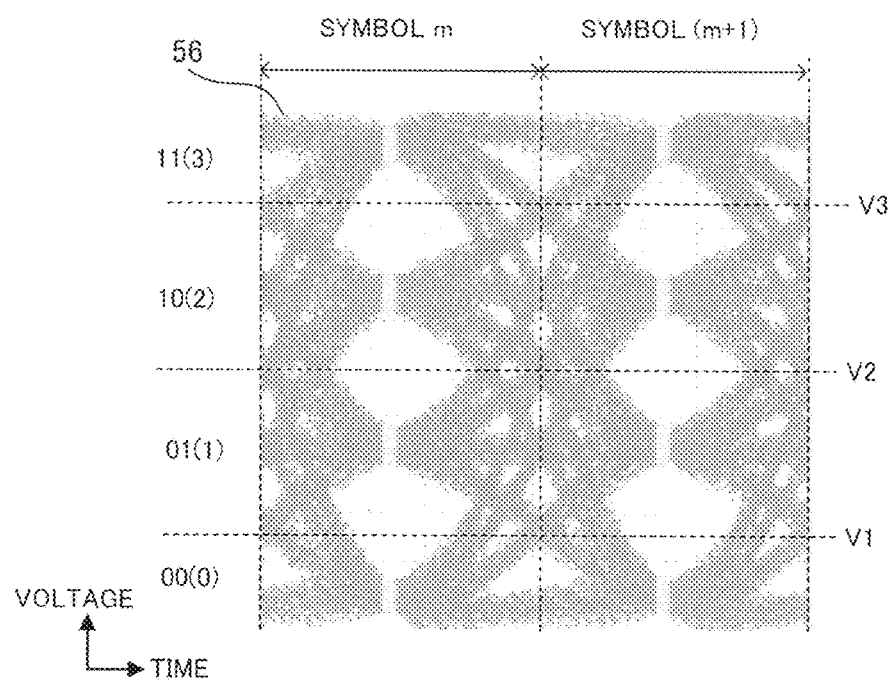
FIG. 10 illustrates an example of assignment of 2-bit values in a PAM-4 data signal.

FIG. 10 illustrates an example of assignment of 2-bit values in a PAM-4 data signal. In FIG. 10, a horizontal axis indicates time and a vertical axis indicates voltage. A waveform 56 is obtained by superimposing all transitions of the data signal Dia.

As illustrated in FIG. 10, a 2-bit value is associated with each of four potential levels separated by thresholds V1, V2, and V3. In the example of FIG. 10, "00" is assigned to the lowest potential level of the four potential levels. "01" is assigned to the next lowest potential level of the four potential levels. "10" is assigned to the next highest potential level of the four potential levels. "11" is assigned to the highest potential level of the four potential levels. A method for assigning 2-bit values is not limited to the above method. 2-bit values may be assigned by the use of a gray code. For example, "00," "01," "11," and "10" are assigned in ascending order of potential level.

Hereinafter each 2-bit value will be referred to as 0, 1, 2, or 3 of a decimal number, in ascending order of potential level.

The threshold V2 which is the center of the thresholds V1, V2, and V3 is the center of the amplitude of the data signal Dia and is, for example, 0 V. Furthermore, if a voltage of the data signal Dia changes between −1 and +1, then the thresholds V3 and V1 are set to, for example, +⅔ and −⅔ respectively. That is to say, the differential (voltage differential) between the thresholds V1 and V2 is equal to the differential between the thresholds V2 and V3.

The CDR circuit 52 includes a PAM-4 data decision circuit 52a and comparator circuits 52b1, 52b2, 52c1, 52c2, 52d1, 52d2, 52e1, and 52e2. Furthermore, the CDR circuit 52 includes a demultiplexer 52f, a phase detection circuit 52g, a filter 52h, phase adjustment circuits 52i1 and 52i2, and a clock generation circuit 52j.

For example, the data decision circuit 52a includes a plurality of comparator circuits which compare the data signal Dia with the above three thresholds V1 through V3, and outputs comparison results (data decision results) obtained by comparing the data signal Dia with the thresholds V1 through V3. Because the data decision circuit 52a performs a half rate operation, the data decision circuit 52a performs a comparison process at timings synchronized with clock signals CKd1 and CKd2 and outputs a 6-bit (=(3 bits per symbol)×2) comparison result.

The data decision circuit 52a may have the function of the aforementioned direct feedback DFE or speculative DFE.

The comparator circuit 52b1 outputs a comparison result obtained by comparing the data signal Dia with a threshold VHH at a timing synchronized with the clock signal CKd1. The comparator circuit 52b2 outputs a comparison result obtained by comparing the data signal Dia with the threshold VHH at a timing synchronized with the clock signal CKd2.

The comparator circuit 52c1 outputs a comparison result obtained by comparing the data signal Dia with a threshold VHL at a timing synchronized with the clock signal CKd1. The comparator circuit 52c2 outputs a comparison result obtained by comparing the data signal Dia with the threshold VHL at a timing synchronized with the clock signal CKd2.

The comparator circuit 52d1 outputs a comparison result obtained by comparing the data signal Dia with a threshold VLH at a timing synchronized with the clock signal CKd1. The comparator circuit 52d2 outputs a comparison result obtained by comparing the data signal Dia with the threshold VLH at a timing synchronized with the clock signal CKd2.

The comparator circuit 52e1 outputs a comparison result obtained by comparing the data signal Dia with a threshold VLL at a timing synchronized with the clock signal CKd1. The comparator circuit 52e2 outputs a comparison result obtained by comparing the data signal Dia with the threshold VLL at a timing synchronized with the clock signal CKd2.

If a voltage of the data signal Dia changes between −1 and +1, then the thresholds VHH, VHL, VLH, and VLL are set to, for example, +1, +⅗, −⅗, and −1 respectively.

The demultiplexer 52f demultiplxes the 6-bit comparison result outputted by the data decision circuit 52a into 3n-bit data and outputs it as an output data signal Doa. Furthermore, the demultiplexer 52f demultiplxes a 2-bit comparison result composed of a 1-bit comparison result outputted by each of the comparator circuits 52b1 and 52b2 into n-bit data and outputs it as a comparison result PHH. In addition, the demultiplexer 52f demultiplxes a 2-bit comparison result composed of a 1-bit comparison result outputted by each of the comparator circuits 52c1 and 52c2 into n-bit data and outputs it as a comparison result PHL. Moreover, the demultiplexer 52f demultiplxes a 2-bit comparison result composed of a 1-bit comparison result outputted by each of the comparator circuits 52d1 and 52d2 into n-bit data and outputs it as a comparison result PLH. Furthermore, the demultiplexer 52f demultiplxes a 2-bit comparison result composed of a 1-bit comparison result outputted by each of the comparator circuits 52e1 and 52e2 into n-bit data and outputs it as a comparison result PLL. n is set, for example, according to the processing capability (which depends on the frequency of an operation clock signal (not illustrated)) of the phase detection circuit 52g realized by a digital circuit.

The phase detection circuit 52g receives the 3n-bit output data signal Doa and comparison results PHH, PHL, PLH, and PLL outputted by the demultiplexer 52f. On the basis of the output data signal Doa and the comparison results PHH, PHL, PLH, and PLL, the phase detection circuit 52g detects the difference in phase between the data signal Dia and the clock signals CKd1 and CKd2. Furthermore, the phase detection circuit 52g outputs a phase difference signal UD as a result of the phase difference detection.

The phase detection circuit 52g is realized by an MM phase detection circuit, for example. This is the same with the phase detection circuit 12e of the receiver circuit 10 according to the first embodiment. An MM phase detection circuit which handles the PAM-4 data signal Dia outputs the phase difference signal UD on the basis of the comparison results PHH, PHL, PLH, and PLL and a value of the output data signal Doa corresponding to two successive symbols.

The filter 52h filters the phase difference signal UD and generates an adjustment signal. The filter 52h is not limited to a digital filter. The filter 52h may be a circuit which includes a charge pump or the like for adjusting a current value according to the phase difference signal UD, which converts the adjusted current value to a voltage value, and which outputs the voltage value as an adjustment signal.

The phase adjustment circuit 5211 receives two of four (or three) clock signals outputted by the clock generation circuit 52j and outputs the clock signals CKd1 and CKd2 whose phases are adjusted on the basis of the adjustment signal outputted by the filter 52h.

The phase adjustment circuit 52i2 receives two (or one) clock signals outputted by the clock generation circuit 52j and outputs a clock signal CKe whose phase is adjusted on the basis of the adjustment signal outputted by the filter 52h and an offset value PSoff. The offset value PSoff is supplied from, for example, a control unit (not illustrated).

The clock generation circuit 52j generates and outputs, for example, four (or three) clock signals of the same frequency.

The comparator circuit 53 outputs a comparison result obtained by comparing the data signal Dia with a threshold TH whose magnitude is adjusted on the basis of an offset value THoff at a timing synchronized with the clock signal CKe. The offset value THoff is supplied from, for example, the control unit (not illustrated).

The demultiplexer 54 demultiplexes a 1-bit comparison result outputted by the comparator circuit 53 into a n/2-bit data and outputs it as a data signal Eoa.

The eye monitor circuit 55 thins comparison results obtained by the data decision circuit 52a for individual symbols of the data signal Dia and selects a comparison result for a symbol for which a comparison result is obtained by the comparator circuit 53. Furthermore, the eye monitor circuit 55 compares the selected comparison result with the comparison result obtained by the comparator circuit 53. By doing so, the eye monitor circuit 55 determines whether or not an error has occurred due to the offset values PSoff and THoff, and outputs an error count ERRcnt[3:0] indicative of the number of times an error has occurred. In addition, when an error determination is made a determined number of times, the eye monitor circuit 55 outputs 1 as a signal ECfin to that effect.

The eye monitor circuit 55 includes a 6-to-1 selector 55a, an error detection circuit 55b, a selector 55c, an error check number counter 55d, and an error number counter 55e.

The 6-to-1 selector 55a receives the output data signal Doa and a selection signal SEL. On the basis of the selection signal SEL, the 6-to-1 selector 55a selects from the output data signal Doa one bit of a 3-bit comparison result per symbol outputted by the data decision circuit 52a for an odd symbol or even symbol of the data signal Dia. As a result, the 6-to-1 selector 55a outputs a n/2-bit data signal. That is to say, the 6-to-1 selector 55a has the function of thinning the comparison results obtained by the data decision circuit 52a. The data decision circuit 52a outputs a comparison result for every symbol. On the other hand, the comparator circuit 53 outputs a comparison result once every two symbols. Furthermore, while the data decision circuit 52a outputs a 3-bit comparison result per symbol, the comparator circuit 53 outputs a 1-bit comparison result per symbol. Therefore, the 6-to-1 selector 55a having such a thinning function is used so as to enable comparison between values of corresponding bits for the same symbol.

The selection signal SEL is supplied from, for example, the control unit (not illustrated). For example, the control unit supplies different selection signals SEL to the 6-to-1 selector 55a according to the magnitude of the offset value THoff (that is to say, according to the potential level of the threshold TH).

For example, the control unit performs the following detection in advance to determine what selection signal SEL to output according to the magnitude of the offset value THoff.

For example, the control unit supplies to the receiver circuit 50 a data signal Dra whose value is fixed at 0. Furthermore, the control unit changes the offset value THoff and detects the offset value THoff at which a comparison result obtained by the comparator circuit 53 is inverted. The threshold TH adjusted by the use of the detected offset value THoff is amplitude level (DC level) 0. To perform the above detection, the control unit is provided with an input terminal to which an output terminal of the comparator circuit 53 is connected.

Similarly, the control unit supplies to the receiver circuit 50 a data signal Dra whose value is fixed at 1, 2, or 3. The control unit changes the offset value THoff and detects each offset value THoff at which a comparison result obtained by the comparator circuit 53 is inverted. The threshold TH adjusted by the use of each detected offset value THoff is amplitude level (DC level) 1, 2, or 3.

Furthermore, when an eye monitoring operation is performed by the use of the receiver circuit 50, the control unit supplies, for example, the following selection signal SEL to the 6-to-1 selector 55a on the basis of the magnitude of the offset value THoff.

If the threshold TH is adjusted by the use of the offset value THoff so as to be between DC level 0 and DC level 1, then the control unit supplies to the 6-to-1 selector 55a the selection signal SEL to the effect of, for example, selecting a bit indicative of a comparison result obtained by comparing the data signal Dia with the threshold V3. If the threshold TH is adjusted by the use of the offset value THoff so as to be between DC level 1 and DC level 2, then the control unit supplies to the 6-to-1 selector 55a the selection signal SEL to the effect of, for example, selecting a bit indicative of a comparison result obtained by comparing the data signal Dia with the threshold V2. If the threshold TH is adjusted by the use of the offset value THoff so as to be between DC level 2 and DC level 3, then the control unit supplies to the 6-to-1 selector 55a the selection signal SEL to the effect of, for example, selecting a bit indicative of a comparison result obtained by comparing the data signal Dia with the threshold V1.

The error detection circuit 55b receives the n/2-bit data signal Eoa outputted by the demultiplexer 54 and the n/2-bit data signal having a bit corresponding to each bit of the data signal Eoa by the function of the above 6-to-1 selector 55a. Furthermore, the error detection circuit 55b compares a value of each bit of the data signal Eoa with a value of a bit corresponding to each bit of the data signal Eoa included in the data signal outputted by the 6-to-1 selector 55a to determine whether or not these values match.

In other words, the error detection circuit 55b uses the offset values PSoff and THoff for making an error determination, that is to say, for determining whether or not there is a mismatch between the data signal Eoa and the output data signal Doa (whether or not an error occurs). Furthermore, each time the error detection circuit 55b makes an error determination, the error detection circuit 55b outputs a signal to the effect that the error detection circuit 55b has made an error determination. If an error has occurred, then the error detection circuit 55b outputs a signal which is indicative that an error has occurred.

The error detection circuit 55b receives a start signal ST. When the start signal ST changes from 0 to 1, the error detection circuit 55b detects synchronization (lock) between the phases of the data signal outputted by the 6-to-1 selector 55a and the data signal Eoa. After the error detection circuit 55b detects the lock, the error detection circuit 55b begins an error determination. The start signal ST is supplied from, for example, the control unit (not illustrated).

The selector 55c receives a signal which is outputted by the error detection circuit 55b and which is indicative that an error has occurred. Furthermore, the selector 55c separately outputs a signal which is indicative that an error has occurred during one symbol according to a value of a comparison result obtained by the data decision circuit 52a for a symbol before the one symbol. In the example of FIG. 9, the data decision circuit 52a is a DFE and the selector 55c corresponds to a case where the tap number of the DFE is one. In this case, the selector 55c separately outputs a signal which is indicative that an error has occurred according to whether a value of the output data signal Doa before one symbol is 0, 1, 2, or 3, and is therefore a 1-to-4 selector.

The error check number counter 55d receives a signal which is outputted by the error detection circuit 55b and which is indicative that the error detection circuit 55b has made an error determination and counts the number of times (error check count) the error detection circuit 55b has made an error determination. Furthermore, when a count value reaches a determined value, the error check number counter 55d outputs 1 as the signal ECfin.

The error number counter 55e receives a signal which is outputted by the selector 55c and which is indicative that an error has occurred, and separately counts the number of times an error has occurred according to whether a value of the output data signal Doa before one symbol is 0, 1, 2, or 3. Furthermore, the error number counter 55e outputs a count result as the error count ERRcnt[3:0].

If the tap number of the DFE is n (n≥2) (if the influence of ISI caused by a symbol before two or more symbols is also taken into consideration), then the selector 55c is a 1-to-$4^n$ selector. The error number counter 55e outputs $4^n$ kinds of error counts.

Figure 11:
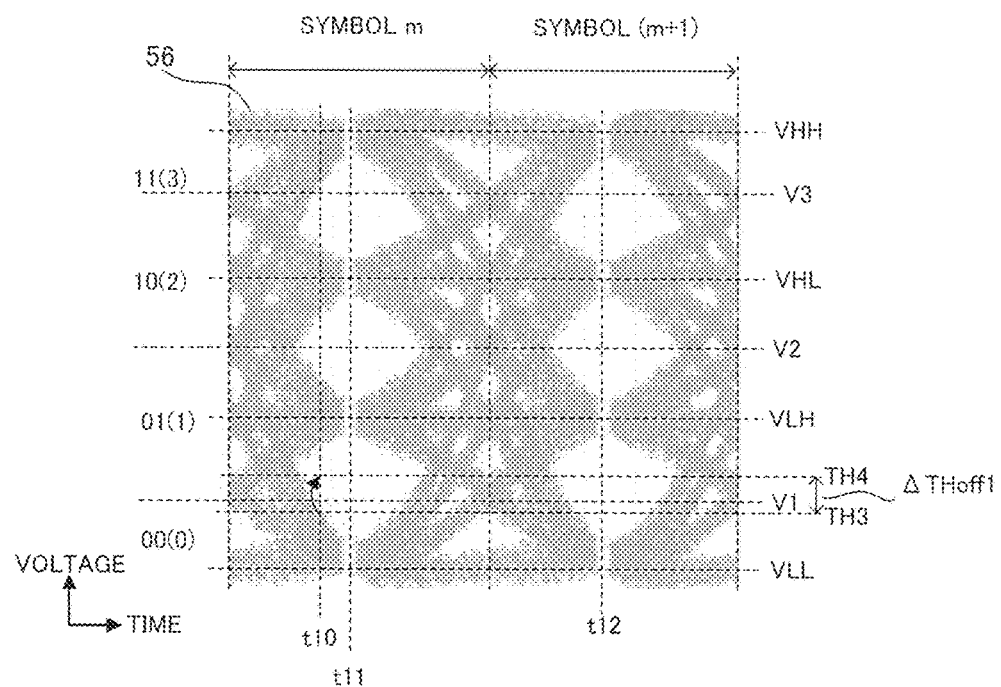
FIG. 11 illustrates an example of adjusting a threshold (part 1)
Figure 12:
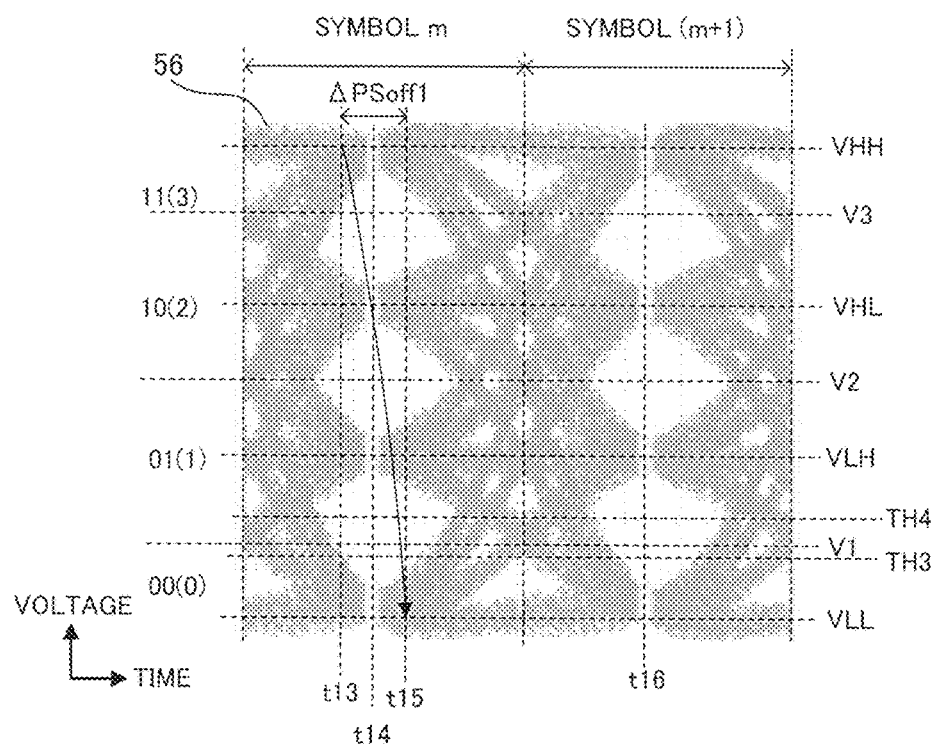
FIG. 12 illustrates an example of adjusting a threshold (part 2)

FIG. 11 and FIG. 12 illustrate an example of adjusting a threshold.

FIG. 11 and FIG. 12 illustrate an example of adjusting the offset values THoff and PSoff for two successive symbols m and (m+1) of the data signal Dia. In FIGS. 11 and 12, a horizontal axis indicates time and a vertical axis indicates voltage. A waveform 56 indicates all transitions of the data signal Dia. Timings t10, t13, and t15 are synchronized with the clock signal CKe, timings t11 and t14 are synchronized with the clock signal CKd1, and timings t12 and t16 are synchronized with the clock signal CKd2.

For example, if the offset value THoff is incremented by ΔTHoff1 at the timing t10, then the threshold TH in the comparator circuit 53 increases from a threshold TH3 to a threshold TH4.

Furthermore, if the offset value THoff reaches a maximum value (a value of the offset value THoff by which the threshold TH reaches the threshold VHH, in the example of FIG. 12) at the timing t13, then the offset value PSoff is incremented by ΔPSoff1. The offset value THoff is set to a minimum value (a value of the offset value THoff by which the threshold TH becomes the threshold VLL, in the example of FIG. 12).

As stated above, the selection signal SEL changes on the basis of a potential level of the threshold TH. For example, if the threshold TH is at the potential level of the threshold TH3 or TH4, then the selection signal SEL which causes the 6-to-1 selector 55a to select a bit indicative of a comparison result obtained by comparing the threshold V1 with the data signal Dia is supplied to the 6-to-1 selector 55a.

(Example of Eye Monitoring Using Receiver Circuit 50)

Even when the receiver circuit 50 according to the third embodiment is used, eye monitoring is realized by the system of FIG. 4 including the control unit 20 and the display unit 20a in the same way as the receiver circuit 10 according to the first embodiment is used. The flow of the eye monitoring operation of the receiver circuit 50 controlled by the control unit 20 is the same as, for example, the flow chart illustrated in FIG. 5.

Furthermore, if the data decision circuit 52a is a direct feedback DFE or speculative DFE, then the control unit 20 corrects an eye waveform on the basis of a correction value used in the data decision circuit 52a. By doing so, an eye waveform after an equalization process by the data decision circuit 52a is realized.

If the data decision circuit 52a is a 1-tap DFE and performs an equalization process on the PAM-4 data signal Dia, then four correction values are used according to whether a value before one symbol is 0, 1, 2, or 3.

Figure 13:
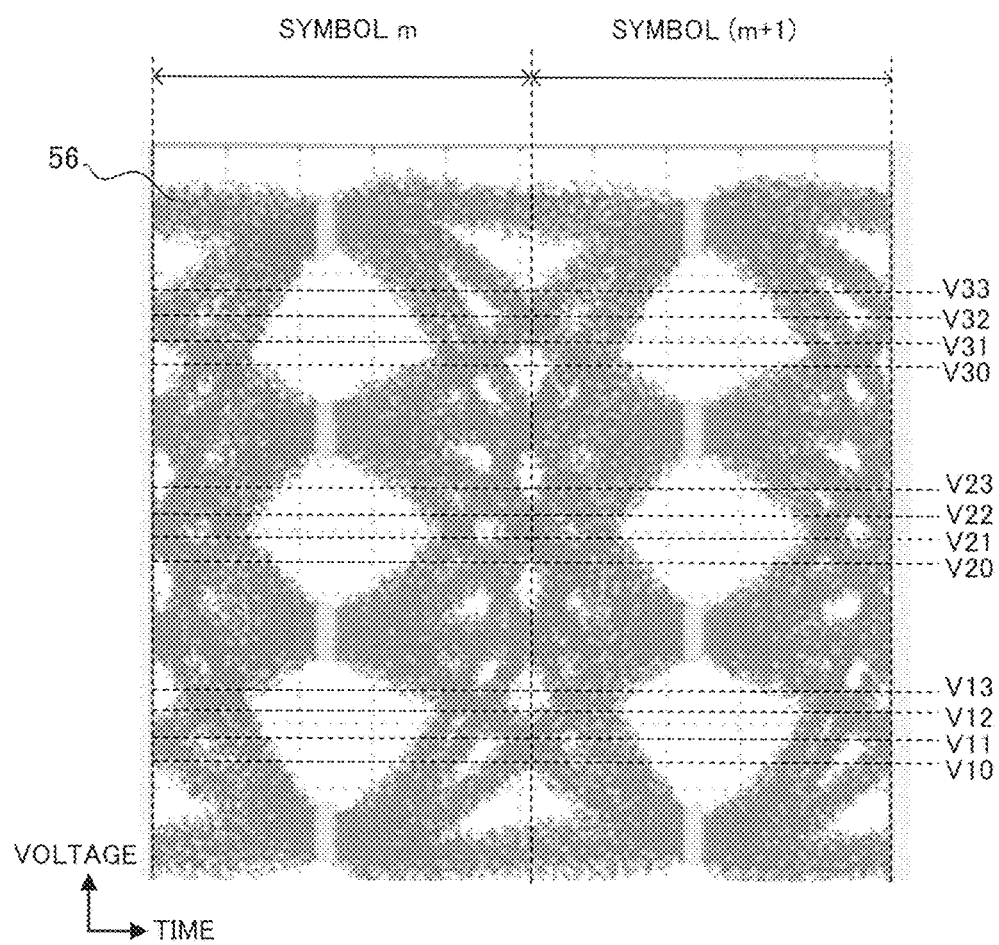
FIG. 13 illustrates an example of a threshold used in a data decision circuit which is a 1-tap decision feedback equalizer (DFE)

FIG. 13 illustrates an example of a threshold used in a data decision circuit which is a 1-tap DFE. In FIG. 13, a horizontal axis indicates time and a vertical axis indicates voltage.

Thresholds V10, V11, V12, and V13 are obtained by adjusting the threshold V1 by four correction values. Thresholds V20, V21, V22, and V23 are obtained by adjusting the threshold V2 by four correction values.

Thresholds V30, V31, V32, and V33 are obtained by adjusting the threshold V3 by four correction values.

If the data decision circuit 52a is a 1-tap speculative DFE, then the data decision circuit 52a outputs the following comparison result for the data signal Dia corresponding to a symbol (m+1) according to a data decision result for a symbol m. If a data decision result for the symbol m is 0, then the data decision circuit 52a outputs a comparison result obtained by comparing the thresholds V10, V20, and V30 with the data signal Dia corresponding to the symbol (m+1). If a data decision result for the symbol m is 1, then the data decision circuit 52a outputs a comparison result obtained by comparing the thresholds V11, V21, and V31 with the data signal Dia corresponding to the symbol (m+1). If a data decision result for the symbol m is 2, then the data decision circuit 52a outputs a comparison result obtained by comparing the thresholds V12, V22, and V32 with the data signal Dia corresponding to the symbol (m+1). If a data decision result for the symbol m is 3, then the data decision circuit 52a outputs a comparison result obtained by comparing the thresholds V13, V23, and V33 with the data signal Dia corresponding to the symbol (m+1).

If the data decision circuit 52a is a 1-tap direct feedback DFE, then one of the four correction values corresponding to a data decision result for the symbol m is added to the data signal Dia corresponding to the symbol (m+1). Furthermore, a comparison result obtained by comparing the data signal Dia to which the correction value has been added with the thresholds V1 through V3 is outputted. This corresponds to outputting a comparison result obtained by comparing three of the thresholds V10 through V33 of FIG. 13 adjusted on the basis of one of the four correction values with the data signal Dia corresponding to the symbol (m+1). If the tap number of the DFE increases, then the number of correction values increases. As a result, the number of thresholds increases.

When the control unit 20 obtains an eye waveform on the basis of the error count ERRcnt[3:0] outputted by the receiver circuit 50, the control unit 20 corrects the eye waveform on the basis of the above correction values. By doing so, an eye waveform after an equalization process by the data decision circuit 52a is equivalently presented to, for example, a user.

When the offset value THoff is increased linearly, the threshold TH may increase nonlinearly, depending on characteristics of the comparator circuit 53. In such a case, the characteristics of the comparator circuit 53 are detected by adding the following circuit.

Figure 14:
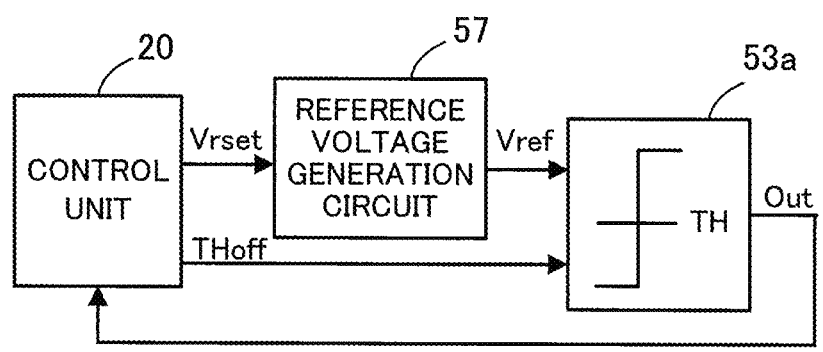
FIG. 14 illustrates an example of a circuit which detects characteristics of a comparator circuit.

FIG. 14 illustrates an example of a circuit which detects characteristics of a comparator circuit.

With a circuit illustrated in FIG. 14, a reference voltage Vref generated by a reference voltage generation circuit 57 is supplied to a comparator circuit 53a having the same characteristics as the comparator circuit 53.

For example, the reference voltage generation circuit 57 outputs the reference voltage Vref whose magnitude is based on a setting signal Vrset supplied from the control unit 20.

Figure 15:
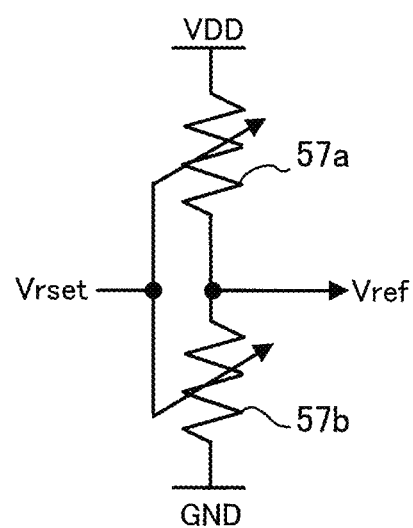
FIG. 15 illustrates an example of a reference voltage generation circuit.

FIG. 15 illustrates an example of a reference voltage generation circuit.

The reference voltage generation circuit 57 includes variable resistors 57a and 57b connected in series between a power supply VDD and a ground GND. The reference voltage Vref is outputted from a node between the variable resistors 57a and 57b.

For example, each of the variable resistors 57a and 57b includes a plurality of resistance elements with switches connected in parallel (not illustrated). The magnitude of the reference voltage Vref is changed by changing the number of switches to be turned on the basis of the setting signal Vrset.

When the control unit 20 detects the characteristics of the comparator circuit 53a, the control unit 20 detects a comparison result (an output signal Out) obtained by the comparator circuit 53a when an offset value THoff is changed. A point where the output signal Out changes from 0 to 1 when the control unit 20 increases the offset value THoff is the intersection of the reference voltage Vref and a threshold TH. The control unit 20 changes the reference voltage Vref linearly by the setting signal Vrset. Each time the control unit 20 changes the reference voltage Vref, the control unit 20 changes the offset value THoff in the above way and detects the aforementioned intersection. This makes it possible to find the nonlinearity of the comparator circuit 53a. The reason for this is as follows. Because the reference voltage Vref changes linearly, the threshold TH at the intersection changes nonlinearly.

The control unit 20 may correct an eye waveform with the above nonlinearity of the comparator circuit 53a taken into consideration. For example, if the threshold TH increases nonlinearly when the control unit 20 increases the offset value THoff linearly, then an error count tends to increase, and an eye of an eye waveform may narrow. Therefore, for example, when the control unit 20 receives the error count ERRcnt[3:0] outputted by the eye monitor circuit 55, the control unit 20 decreases the error count ERRcnt[3:0] according to the degree of the nonlinearity of the comparator circuit 53a to correct an eye waveform.

The comparator circuit 53 of the receiver circuit 50 may be used as the comparator circuit 53a. In that case, a switch which connects the comparator circuit 53 and the reference voltage generation circuit 57 is used at the time of detecting the characteristics of the comparator circuit 53.

Furthermore, an eye waveform correction corresponding to the characteristics of the comparator circuit 53 may be performed in the same way in a case where the receiver circuit 10 according to the first embodiment is used.

The above eye monitoring function is realized by the use of the above receiver circuit 50 according to the third embodiment. Furthermore, one comparator circuit 53 is used in place of the same circuit as the data decision circuit 52a. This reduces power consumption. Furthermore, with the receiver circuit 50 an error determination is made once every two symbols. Therefore, an eye monitoring function is realized by one clock signal CKe and power consumption is reduced.

In the above example, the receiver circuit 50 which performs a half rate operation is described. However, an operation performed by the receiver circuit 50 is not limited to a half rate operation. For example, if a receiver circuit which performs a full rate operation is realized, then a data decision circuit 52a outputs 3-bit data and each comparator circuit compares a threshold VLL, VLH, VHL, or VHH with a data signal Dia. Furthermore, a 3-to-1 selector is used in place of the 6-to-1 selector 55a.

On the other hand, if the receiver circuit 50 is extended to a receiver circuit which performs a quarter rate operation, then comparator circuits and the like are properly added.

In addition, a plurality of comparator circuits may be used in place of one comparator circuit 53. For example, two comparator circuits which compare two thresholds corresponding to any two of thresholds V1, V2, and V3 and a data signal Dia may be used. In that case, for example, the two thresholds are adjusted at the same time by an offset value THoff. Furthermore, a 3-to-1 selector is used in place of the 6-to-1 selector 55a.

Fourth Embodiment

Figure 16:
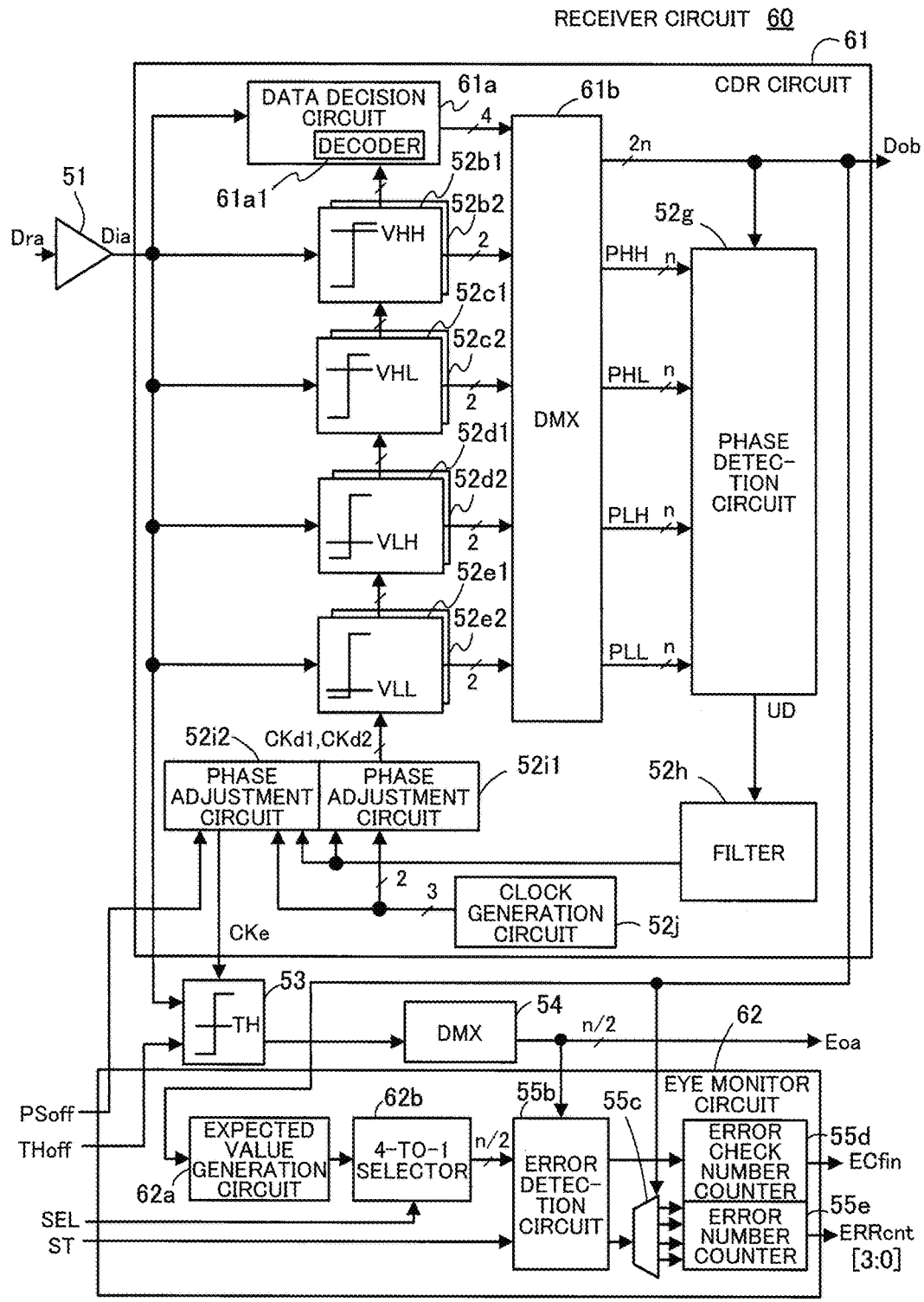
FIG. 16 illustrates an example of a receiver circuit according to a fourth embodiment.

FIG. 16 illustrates an example of a receiver circuit according to a fourth embodiment. Components in FIG. 16 which are the same as those of the receiver circuit 50 illustrated in FIG. 9 are marked with the same numerals.

With a receiver circuit 60 according to the fourth embodiment a data decision circuit 61a of a CDR circuit 61 includes a decoder 61a1. The decoder 61a1 decodes four PAM-4 values on the basis of comparison results obtained by comparing three thresholds with a data signal Dia. For example, if the data signal Dia is larger than a threshold V1 and is smaller than a threshold V2, then the decoder 61a1 outputs "01" as a decoding result. Because the receiver circuit 60 performs a half rate operation, the data decision circuit 61a outputs a decoding result corresponding to two symbols, that is to say, a 4-bit value.

A demultiplexer 61b of the CDR circuit 61 outputs n-bit comparison results PHH, PHL, PLH, and PLL. Furthermore, the demultiplexer 61b demultiplexes a 4-bit comparison result outputted by the data decision circuit 61a into 2n-bit data and outputs it as an output data signal Dob.

An expected value generation circuit 62a of an eye monitor circuit 62 outputs a 2n-bit expected value on the basis of the output data signal Dob. An expected value is a value of a data pattern, such as 0101, in which 0 and 1 are repeated or a value of a predictable data pattern such as a PRBS. If a value of such a data pattern is used as an expected value, its test pattern is supplied as a data signal Dra to the receiver circuit 60 when an eye monitoring function is performed. After the expected value generation circuit 62a receives the above data pattern once as a seed (at initial operation, for example), the expected value generation circuit 62a estimates an expected value. Even if an error has occurred in the output data signal Dob, it is possible to continue to output a correct value.

A 4-to-1 selector 62b receives the 2n-bit expected value and a selection signal SEL. On the basis of the selection signal SEL, the 4-to-1 selector 62b selects from the expected value one bit of a 2-bit decoding result per symbol outputted by the data decision circuit 61a for an odd or even symbol of the data signal Dia. As a result, a n/2-bit data signal is outputted from the 4-to-1 selector 62b.

If, as illustrated in FIG. 10, a 2-bit value is associated with each of four potential levels, then the selection signal SEL changes, for example, in the following manner according to the magnitude of a threshold TH. If the magnitude of the threshold TH is between DC level 0 and DC level 1, then the selection signal SEL causes the 4-to-1 selector 62b to select the least significant bit of a 2-bit decoding result per symbol. Furthermore, if the magnitude of the threshold TH is between DC level 1 and DC level 2, then the selection signal SEL causes the 4-to-1 selector 62b to select the most significant bit of a 2-bit decoding result per symbol. If the magnitude of the threshold TH is between DC level 2 and DC level 3, then the selection signal SEL causes the 4-to-1 selector 62b to select the least significant bit of a 2-bit decoding result per symbol.

The other operations of the receiver circuit 60 are the same as those of the receiver circuit 50 illustrated in FIG. 9 and the same effect that is obtained by the receiver circuit 50 is achieved by the receiver circuit 60. In addition, with the receiver circuit 60 the number of bits included in an output signal (decoding result) of the data decision circuit 61a is smaller. This simplifies the circuit structures of the demultiplexer 61b and a phase detection circuit 52g.

A selector 55c may separately output a signal which is indicative that an error has occurred according to an expected value before one symbol generated by the expected value generation circuit 62a.

In addition, the expected value generation circuit 62a may not be used. In that case, the output data signal Dob (decoding result) is supplied to the 4-to-1 selector 62b.

Fifth Embodiment

Figure 17:
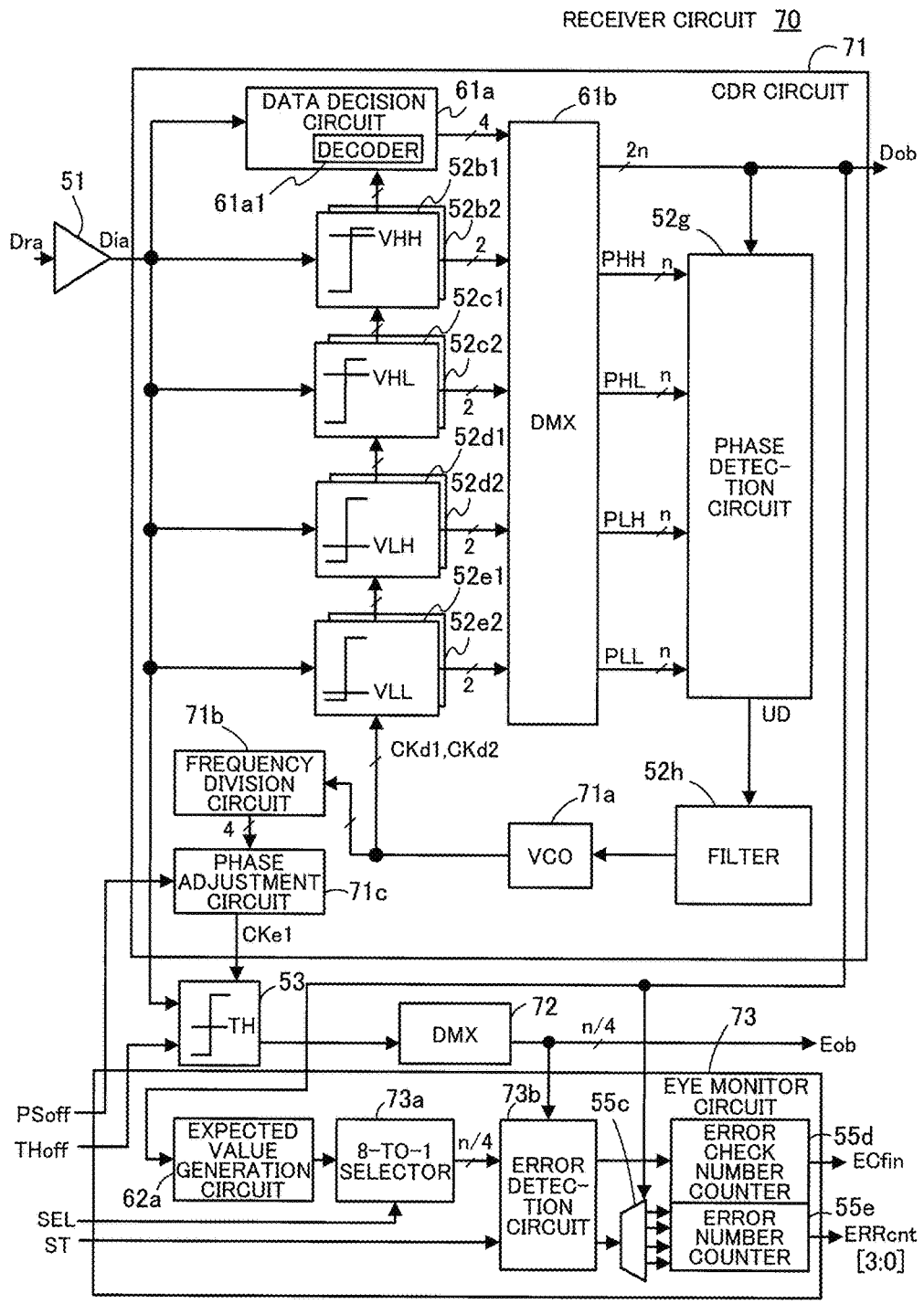
FIG. 17 illustrates an example of a receiver circuit according to a fifth embodiment.

FIG. 17 illustrates an example of a receiver circuit according to a fifth embodiment. Components in FIG. 17 which are the same as those of the receiver circuit 60 illustrated in FIG. 16 are marked with the same numerals.

A CDR circuit 71 of a receiver circuit 70 according to the fifth embodiment includes a voltage controlled oscillator (VCO) 71a in place of a clock generation circuit 52j and a phase adjustment circuit 52i1 included in the CDR circuit 61 of the receiver circuit 60 according to the fourth embodiment. In addition, the CDR circuit 71 includes a frequency division circuit 71b and a phase adjustment circuit 71c.

The VCO 71a outputs clock signals CKd1 and CKd2 whose phases are adjusted on the basis of an adjustment signal outputted by a filter 52h. That is to say, the VCO 71a has the functions of the clock generation circuit 52j and the phase adjustment circuit 52i1 included in the CDR circuit 61 of the receiver circuit 60 according to the fourth embodiment.

The frequency division circuit 71b divides frequencies of the clock signals CKd1 and CKd2 by two and outputs four clock signals which differ in phase.

A phase adjustment circuit 71c adjusts the phase of one of the four clock signals on the basis of an offset value PSoff and supplies it to a comparator circuit 53 as a clock signal CKe1.

A demultiplexer 72 demultiplexes a 1-bit comparison result outputted by the comparator circuit 53 into a n/4-bit data and outputs it as a data signal Eob.

An 8-to-1 selector 73a of an eye monitor circuit 73 receives a 2n-bit expected value and a selection signal SEL. On the basis of the selection signal SEL, the 8-to-1 selector 73a selects from the expected value one bit of a 2-bit decoding result per symbol outputted by a data decision circuit 61a for one of four successive symbols of a data signal Dia. As a result, a n/4-bit data signal is outputted from the 8-to-1 selector 73a.

An error detection circuit 73b receives the n/4-bit data signal Eob outputted by the demultiplexer 72 and the n/4-bit data signal having a bit corresponding to each bit of the data signal Eob by the function of the above 8-to-1 selector 73a. Furthermore, the error detection circuit 73b determines whether or not a value of each bit of the data signal Eob matches a value of a bit corresponding to each bit of the data signal Eob included in the data signal outputted by the 8-to-1 selector 73a.

In other words, the error detection circuit 73b uses the offset values PSoff and an offset value THoff for making an error determination, that is to say, for determining whether or not there is a mismatch between the data signal Eob and the output data signal Dob (whether or not an error occurs). Furthermore, each time the error detection circuit 73b makes an error determination, the error detection circuit 73b outputs a signal to the effect that the error detection circuit 73b has made an error determination. If an error has occurred, then the error detection circuit 73b outputs a signal which is indicative that an error has occurred.

The error detection circuit 73b receives a start signal ST. When the start signal ST changes from 0 to 1, the error detection circuit 73b detects synchronization (lock) between the phases of the data signal outputted by the 8-to-1 selector 73a and the data signal Eob. After the error detection circuit 73b detects the lock, the error detection circuit 73b begins an error determination.

The other operations of the receiver circuit are the same as those of the receiver circuit 50 illustrated in FIG. 9. The comparator circuit 53 of the receiver circuit 70 makes a data decision once every four symbols. Therefore, the frequency of data decision is low compared with the receiver circuit 50, and power consumption is reduced further.

In the above example, the frequency division circuit 71b divides frequencies of the clock signals CKd1 and CKd2 by two. However, another frequency division method may be adopted. The frequency division circuit 71b may divide frequencies of the clock signals CKd1 and CKd2 by four. In that case, a 16-to-1 selector is used in place of the 8-to-1 selector 73a.

By the way, the description has been given on the assumption that the receiver circuits 50, 60, and 70 according to the above third, fourth, and fifth embodiments receive the PAM-4 data signal Dra. However, the receiver circuits 50, 60, and 70 may be extended to receiver circuits which receive a greater multilevel data signal such as a PAM-8 data signal. In that case, the number of thresholds with which a data signal is compared increases. As a result, the number of circuits, such as comparator circuits, increases. In addition, the ratio of inputs to outputs of a selector (6-to-1 selector 55a illustrated in FIG. 9, for example) is changed. With a receiver circuit which receives a PAM-8 data signal Dra, for example, a 14-to-1 selector and a 1-to-8 selector are used in place of the 6-to-1 selector 55a and the selector 55c respectively.

According to an aspect of the embodiments, power consumption of a receiver circuit having an eye monitoring function is reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A receiver circuit comprising:
a clock data recovery (CDR) circuit which receives a data signal, which detects, based on a first comparison result obtained by comparing the data signal with a first threshold at a first timing synchronized with a first clock signal and a second comparison result obtained by comparing the data signal with a plurality of second thresholds at the first timing, a difference in phase between the data signal and the first clock signal, and which adjusts a phase of the first clock signal, based on the difference in phase;
a comparator circuit which outputs a third comparison result obtained by comparing the data signal with a third threshold whose magnitude is adjusted based on a first offset value at a second timing synchronized with a second clock signal whose phase is adjusted based on the difference in phase and a second offset value; and
an eye monitor circuit which thins the first comparison result obtained for individual symbols of the data signal or a first value obtained based on the first comparison result, which selects a fourth comparison result or a second value corresponding to a first symbol for which the third comparison result is obtained, which determines, by comparing the third comparison result with the fourth comparison result or the second value, whether or not an error has occurred due to the first offset value or the second offset value, and which outputs a number of times the error has occurred.
2. The receiver circuit according to claim 1, wherein the eye monitor circuit includes:
an error detection circuit which determines, by comparing the first comparison result with the fourth comparison result or the second value, whether or not the error has occurred; and
a selector which thins the first comparison result obtained for the individual symbols of the data signal or the first value to select the fourth comparison result or the second value to be supplied to the error detection circuit.

3. The receiver circuit according to claim 2, wherein
the selector thins the first comparison result or the first value, based on a difference between a frequency with which the first comparison result is obtained in the CDR circuit and a frequency with which the comparator circuit outputs the third comparison result, to select the fourth comparison result or the second value to be supplied to the error detection circuit.

4. The receiver circuit according to claim 2, wherein:
when the data signal is a multilevel signal having n (n≥4) values per symbol, the first threshold includes a plurality of fourth thresholds whose number corresponds to n; and
the selector selects, based on a potential level of the third threshold, the fourth comparison result obtained by comparing one of the plurality of fourth thresholds with the data signal or the second value and supplies the selected fourth comparison result or the selected second value to the error detection circuit.

5. The receiver circuit according to claim 1, wherein the eye monitor circuit further includes a counter which separately counts an occurrence of the error for the first symbol according to a value of the first comparison result for a second symbol before the first symbol or according to the first value and which outputs the number of times the error has occurred according to the value of the first comparison result for the second symbol or according to the first value.

6. The receiver circuit according to claim 1, further comprising an expected value generation circuit which receives the first comparison result based on a predictable data pattern and which outputs the first value in accordance with the data pattern.

7. The receiver circuit according to claim 4, wherein the CDR circuit decodes the first value which is each of the n values, based on the first comparison result, and supplies a decoding result to the eye monitor circuit.

8. An eye monitor system comprising:
a receiver circuit including:
a clock data recovery (CDR) circuit which receives a data signal, which detects, based on a first comparison result obtained by comparing the data signal with a first threshold at a first timing synchronized with a first clock signal and a second comparison result obtained by comparing the data signal with a plurality of second thresholds at the first timing, a difference in phase between the data signal and the first clock signal, and which adjusts a phase of the first clock signal based on the difference in phase;
a comparator circuit which outputs a third comparison result obtained by comparing the data signal with a third threshold whose magnitude is adjusted based on a first offset value at a second timing synchronized with a second clock signal whose phase is adjusted based on the difference in phase and a second offset value; and
an eye monitor circuit which thins the first comparison result obtained for individual symbols of the data signal or a first value obtained based on the first comparison result, which selects a fourth comparison result or a second value corresponding to a first symbol for which the third comparison result is obtained, which determines, by comparing the third comparison result with the fourth comparison result or the second value, whether or not an error has occurred due to the first offset value or the second offset value, and which outputs a number of times the error has occurred; and
a control unit which adjusts the first offset value and the second offset value, which receives the number of times the error has occurred, and which causes, based on the number of times the error has occurred that is obtained each time the first offset value or the second offset value is adjusted, a display unit to display an eye waveform of the data signal.

9. The eye monitor system according to claim 8, wherein:
the eye monitor circuit separately counts an occurrence of the error for the first symbol according to a value of the first comparison result for a second symbol before the first symbol or according to the first value and outputs the number of times the error has occurred according to the value of the first comparison result for the second symbol or according to the first value; and
the control unit corrects the eye waveform, based on the number of times the error has occurred, according to the value of the first comparison result for the second symbol or according to the first value and a correction value according to the value of the first comparison result for the second symbol or according to the first value.

* * * * *